United States Patent
Kwon et al.

(10) Patent No.: US 12,152,184 B2
(45) Date of Patent: Nov. 26, 2024

(54) CORE SHELL QUANTUM DOT, PRODUCTION METHOD THEREOF, AND ELECTRONIC DEVICE INCLUDING THE SAME

(71) Applicant: SAMSUNG ELECTRONICS CO., LTD., Suwon-si (KR)

(72) Inventors: Soo Kyung Kwon, Suwon-si (KR); Yong Wook Kim, Yongin-si (KR); Seon-Yeong Kim, Suwon-si (KR); Ji-Yeong Kim, Suwon-si (KR); Jihyun Min, Seoul (KR); Eun Joo Jang, Suwon-si (KR); Seonmyeong Choi, Suwon-si (KR); Sungwoo Hwang, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 765 days.

(21) Appl. No.: 17/243,741

(22) Filed: Apr. 29, 2021

(65) Prior Publication Data

US 2021/0348055 A1   Nov. 11, 2021

(30) Foreign Application Priority Data

May 6, 2020   (KR) .......... 10-2020-0053794

(51) Int. Cl.
*C09K 11/88* (2006.01)
*C09K 11/56* (2006.01)
(Continued)

(52) U.S. Cl.
CPC .......... *C09K 11/565* (2013.01); *C09K 11/883* (2013.01); *H10K 85/10* (2023.02);
(Continued)

(58) Field of Classification Search
CPC ..... C09K 11/565; C09K 11/883; C09K 11/88; C09K 11/56
See application file for complete search history.

(56) References Cited

U.S. PATENT DOCUMENTS

2018/0119007 A1   5/2018   Ippen et al.
2018/0327665 A1*  11/2018   Lee .................. C09K 11/02
(Continued)

FOREIGN PATENT DOCUMENTS

EP   2317568 A2   5/2011
JP   2018115315 A   7/2018
(Continued)

OTHER PUBLICATIONS

H Asano et al., "Synthesis of colloidal Zn(Te,Se) alloy quantum dots," Materials Research Express, Oct. 3, 2017, pp. 1-11, vol. 4, Issue. 106501.
(Continued)

*Primary Examiner* — Eric K Ashbahian
*Assistant Examiner* — Halee Cramer
(74) *Attorney, Agent, or Firm* — CANTOR COLBURN LLP

(57) ABSTRACT

A quantum dot including a core including a first semiconductor nanocrystal including zinc, selenium, and tellurium, and a semiconductor nanocrystal shell disposed on the core, the semiconductor nanocrystal shell including zinc, and selenium, sulfur, or a combination thereof, wherein the quantum dot does not include cadmium, a mole ratio of tellurium relative to selenium in the first semiconductor nanocrystal is greater than about 1:1, a mole ratio of a sum of selenium and sulfur relative to in the quantum dot is greater than about 1:1, a wavelength of a maximum emission peak of the quantum dot is in a range of about 500 nanometers (nm) to about 550 nm, and the quantum dot has
(Continued)

quantum efficiency (QY) of greater than or equal to about 30%, a quantum dot-polymer composite including the quantum dot, a display device including the quantum dot-polymer composite, and an electroluminescent device including the quantum dot.

20 Claims, 12 Drawing Sheets
(3 of 12 Drawing Sheet(s) Filed in Color)

(51) Int. Cl.
  *H10K 85/10* (2023.01)
  *B82Y 20/00* (2011.01)
  *B82Y 30/00* (2011.01)
  *B82Y 40/00* (2011.01)
  *H10K 50/115* (2023.01)
  *H10K 50/16* (2023.01)
  *H10K 50/17* (2023.01)
(52) U.S. Cl.
  CPC ............... *B82Y 20/00* (2013.01); *B82Y 30/00* (2013.01); *B82Y 40/00* (2013.01); *H10K 50/115* (2023.02); *H10K 50/16* (2023.02); *H10K 50/171* (2023.02)

(56) References Cited

U.S. PATENT DOCUMENTS

| | | | |
|---|---|---|---|
| 2019/0112523 A1* | 4/2019 | Kim | ........................ C09K 11/65 |
| 2019/0119569 A1* | 4/2019 | Lee | ........................ C01B 19/007 |
| 2019/0153317 A1 | 5/2019 | Kim et al. | |
| 2019/0367810 A1 | 12/2019 | Omata et al. | |
| 2020/0332191 A1 | 10/2020 | Kwon et al. | |

FOREIGN PATENT DOCUMENTS

| | | |
|---|---|---|
| KR | 1774775 B1 | 9/2017 |
| KR | 20180124765 A | 11/2018 |
| KR | 20190057802 A | 5/2019 |
| KR | 1020200122719 A | 10/2020 |

OTHER PUBLICATIONS

Hiroshi Asano et al., "Colloidal Zn(Te,Se)/ZnS Core/Shell Quantum Dots Exhibiting Narrow-Band and Green Photoluminescence," ACS Omega, Jun. 20, 2018, pp. 6703-6709, vol. 3.

Jiwon Bang et al., "ZnTe/ZnSe (Core/Shell) Type-II Quantum Dots: Their Optical and Photovoltaic Properties," Chemistry of Materials, 2010, pp. 233-240, vol. 22, and Supporting Information.

* cited by examiner

CORE SHELL QUANTUM DOT, PRODUCTION METHOD THEREOF, AND ELECTRONIC DEVICE INCLUDING THE SAME

CROSS-REFERENCE TO RELATED APPLICATION

This application claims priority to and the benefit of Korean Patent Application No. 10-2020-0053794 filed in the Korean Intellectual Property Office on May 6, 2020, and all the benefits accruing therefrom under 35 U.S.C. § 119, the content of which in its entirety is herein incorporated by reference.

BACKGROUND

1. Field

A core shell quantum dot, a production method thereof, and an electronic device including the same are disclosed.

2. Description of the Related Art

Physical characteristics (e.g., bandgap energies, melting point, etc.) of nanoparticles that are intrinsic characteristics of the nanoparticles may be controlled by changing particle sizes of the nanoparticles, unlike bulk materials. For example, semiconductor nanocrystal particles also referred to as quantum dots are a crystalline material having a size of several nanometers. Such semiconductor nanocrystal particles have such a small size that the semiconductor nanocrystal particles have a large surface area per unit volume and exhibit quantum confinement effects, and thus have different properties from the characteristics of bulk materials having the same composition. Quantum dots may absorb light from an excitation source to be in an excitation state, and may emit energy corresponding to bandgap energies of the quantum dots.

SUMMARY

An embodiment provides a cadmium-free quantum dot capable of realizing, e.g., exhibiting, improved optical properties, such as, for example, a high luminous efficiency and a low, e.g., narrow, full width at half maximum (FWHM) of an emission peak.

An embodiment provides a quantum dot-polymer composite including the cadmium-free quantum dot.

An embodiment provides a display device including the quantum dot-polymer composite.

An embodiment provides an electroluminescent device including the cadmium-free quantum dots in a light emitting layer.

A quantum dot of an embodiment includes a core including a first semiconductor nanocrystal including zinc, selenium, and tellurium, and a semiconductor nanocrystal shell disposed on the core, the semiconductor nanocrystal shell including zinc, and selenium, sulfur, or a combination thereof, wherein the quantum dot does not include cadmium, a mole ratio of tellurium relative to selenium in the first semiconductor nanocrystal is greater than about 1:1, a mole ratio of a sum of selenium and sulfur relative to tellurium in the quantum dot is greater than about 1:1, a wavelength of a maximum emission peak of the quantum dot is in a range of about 500 nanometers (nm) to about 550 nm, and the quantum dot has quantum efficiency (QY) of greater than or equal to about 30%.

The wavelength of the maximum emission peak may be in a range of greater than or equal to about 500 nm and less than or equal to about 540 nm.

A full width at half maximum (FWHM) of the maximum emission peak of the quantum dot may be less than or equal to about 30 nm.

The quantum dot has a mole ratio of zinc to a sum of selenium and sulfur in the quantum dot may be greater than or equal to about 1:1.

A radius of the core of the quantum dot may be less than or equal to about 2 nm.

A radius of the core of the quantum dot may be less than or equal to about 1.8 nm.

A thickness of the shell of the quantum dot may be about 1 monolayer or more.

An average particle size of the quantum dot may be greater than or equal to about 3 nm.

An average particle size of the quantum dot may be greater than or equal to about 3.5 nm.

The semiconductor nanocrystal shell of the quantum dot may have a composition that changes in the radial direction.

The semiconductor nanocrystal shell of the quantum dot may include a first layer disposed directly on the core, and a second layer disposed on the first layer, wherein the first layer may include a second semiconductor nanocrystal, and the second layer may include a third semiconductor nanocrystal having a composition different from that of the second semiconductor nanocrystal.

The second semiconductor nanocrystal may include zinc, selenium, and optionally sulfur, and the third semiconductor nanocrystal may include zinc and sulfur.

The second layer of the semiconductor nanocrystal shell may be an outermost layer, and the third semiconductor nanocrystal may not include selenium.

A surface of the quantum dot may include RCOOH, RCOOCOR, $RNH_2$, $R_2NH$, $R_3N$, RSH, $R_3PO$, $R_3P$, ROH, RCOOR', $RPO(OH)_2$, $R_2POOH$, or a combination thereof, wherein R and R' are independently a substituted or unsubstituted C1 to C30 aliphatic hydrocarbon group, a substituted or unsubstituted C6 to C30 substituted or unsubstituted aromatic hydrocarbon group, or a combination thereof.

A quantum dot-polymer composite according to an embodiment includes a polymer matrix, and a quantum dot according to an embodiment dispersed in the polymer matrix.

The polymer matrix may include a thiol-ene resin, a (meth)acrylate polymer, a urethane polymer, an epoxy polymer, a vinyl polymer, a silicone polymer, or a combination thereof.

A display device according to an embodiment includes a light source and a luminescent element, wherein the luminescent element includes the quantum dot-polymer composite according to an embodiment, and the light source is configured to provide the luminescent element with incident light.

An electroluminescent device according to an embodiment includes a first electrode and a second electrode facing each other, and a quantum dot light emitting layer between the first electrode and the second electrode, the quantum dot light emitting layer including a plurality of quantum dots, wherein the quantum dots include the quantum according to an embodiment.

The electroluminescent device may include a charge auxiliary layer between the first electrode and the quantum dot light emitting layer, between the second electrode and the quantum dot light emitting layer, or between the first electrode and the quantum dot light emitting layer and between the second electrode and the quantum dot light emitting layer.

The charge auxiliary layer may include a charge transporting layer, a charge injecting layer, or a combination thereof.

The quantum dot according to an embodiment emits green light and exhibits high quantum efficiency (e.g., quantum yield), and a maximum emission peak of the quantum dot has a low, e.g., narrow, full width at half maximum (FWHM), and thus the quantum dot may exhibit excellent optical properties. Such a quantum dot may be used in a color conversion layer of a display device or a light emitting layer of an electroluminescent device to implement a high color reproduction display. In addition, such a quantum dot may be desirably used for a biological labeling (biosensor, bio-imaging), a photodetector, a solar cell, a hybrid composite, and the like.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The above and other advantages and features of this disclosure will become more apparent by describing in further detail exemplary embodiments thereof with reference to the accompanying drawings, in which.

DETAILED DESCRIPTION

Figure 1A:
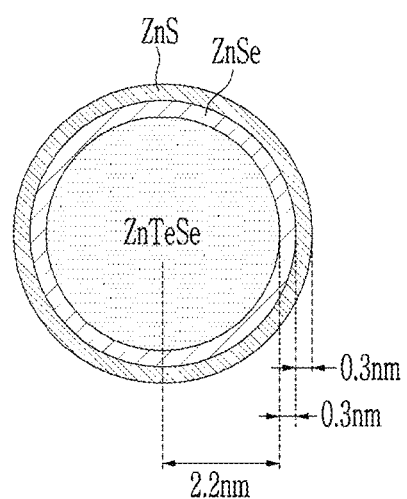
FIGS. 1A and 1B are schematic views showing cross-sections of two types of ZnTeSe-based quantum dots having the same total particle diameter, but different core radii and shell thicknesses.

Advantages and characteristics of this disclosure, and a method for achieving the same, will become evident referring to the following example embodiments together with the drawings attached hereto. However, the embodiments should not be construed as being limited to the embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined.

In addition, unless explicitly described to the contrary, the word "comprise," and variations such as "comprises" or "comprising," will be understood to imply the inclusion of stated elements but not the exclusion of any other elements.

Further, the singular includes the plural unless mentioned otherwise.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

Further, the singular includes the plural unless mentioned otherwise. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be understood that, although the terms "first," "second," "third," etc. may be used herein to describe various elements, components, regions, layers, and/or sections, these elements, components, regions, layers and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein. Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below. "About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value. Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, as used herein, when a definition is not otherwise provided, "substituted" refers to replacement of hydrogen of a compound or a corresponding moiety by a substituent such as a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino or amine group (—NRR' wherein R and R' are independently hydrogen or C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

Herein, "hydrocarbon group" refers to a group including carbon and hydrogen (e.g., an alkyl, alkenyl, alkynyl, or aryl group). The hydrocarbon group may be a group having a monovalence or greater formed by removal of one or more hydrogen atoms from, alkane, alkene, alkyne, or arene. In the hydrocarbon group, a, e.g., at least one, methylene may be replaced by an oxide moiety, a carbonyl moiety, an ester moiety, —NH—, or a combination thereof.

Herein, "alkyl" refers to a linear or branched saturated monovalent hydrocarbon group (methyl, ethyl, hexyl, etc.).

Herein, "alkenyl" refers to a linear or branched monovalent hydrocarbon group having one or more carbon-carbon double bond.

Herein, "alkynyl" refers to a linear or branched monovalent hydrocarbon group having one or more carbon-carbon triple bond.

Herein, "aryl" refers to a group formed by removal of a, e.g., at least one, hydrogen from an aromatic group (e.g., a phenyl or naphthyl group).

Herein, "hetero" refers to inclusion of 1 to 3 heteroatoms such as N, O, S, Si, P, or a combination thereof.

As used herein, "Group" refers to a group of the periodic table of the elements.

"Group III" may include Groups IIIA and IIIB, and examples of Group III metals include In, Ga, and TI, but are not limited thereto.

"Group V" may include Group VA, and examples may include nitrogen, phosphorus, arsenic, antimony, and bismuth, but are not limited thereto.

Semiconductor nanocrystal particles (hereinafter, also referred to as quantum dots) may absorb light from an excitation source and may emit energy corresponding to bandgap energies of the semiconductor nanocrystal particles. Bandgap energies of quantum dots may be changed according to sizes, compositions, or a combination thereof of the nanocrystal particles. For example, as the sizes of quantum dots increase, the quantum dots may have narrower bandgap energies and increased emission wavelengths, e.g., maximum emission peak wavelengths. Semiconductor nanocrystals have drawn attention as light emitting materials in various fields of a display device, an energy device, or a bioluminescent device.

Quantum dots having luminescence properties at a desirable level may be based on cadmium (Cd). Cadmium may cause severe environment/health problems and is a restricted element by Restriction of Hazardous Substances Directive (RoHS) in a plurality of countries. Therefore, it is desirable to develop cadmium-free quantum dots which may emit light of a desired wavelength while having improved luminescence properties, for example, when applied to, e.g., used in, an electroluminescent device. An InP-based quantum dot (QD) is a cadmium-free quantum dot that may be applicable to devices, e.g., provide desirable properties when used in a device.

On the other hand, for example, in order to realize, e.g., provide, a display having high color reproducibility under BT2020, which is a next-generation standard in a quantum dot display in which a color conversion layer includes quantum dots, it may be desirable that a light emitting material has a reduced, e.g., narrow, FWHM. However, a quantum dot based on, e.g., including, a Group III-V compound including indium (In) and phosphorus (P) may have a smaller band gap and a larger Bohr radius than a cadmium-based core such as a CdSe core, so that the FWHM of a maximum emission peak of the quantum dot may change greatly depending on, e.g., with a change of, a size of the quantum dot. It may be difficult for InP-based quantum dots to exhibit a reduced level of, e.g., narrow, FWHM while emitting light of a desired wavelength, such as greater than about 470 nm, greater than or equal to about 475 nm, greater than or equal to about 480, and less than or equal to about 550 nm. Cores including indium and phosphorus may be susceptible to surface oxidation, so the FWHM of a maximum emission peak of a quantum dot may increase by, e.g., with, shell coating, and it may be difficult to achieve a desired level of quantum efficiency and FWHM at the same time. Quantum dots based on Group III-V compound (e.g., InP) cores may not exhibit a reduced, e.g., decreased, FWHM to a desired level, e.g., a desirable FWHM, even when a size distribution, e.g., thickness of the shell, is controlled to be less than or equal to about 1 monolayer (ML).

The inventors have surprising found that cadmium-free ZnTeSe-based quantum dots have a limited difference in emission wavelength depending on a particle size distribution, e.g., the wavelength of the maximum emission peak varies little with a change in particle size, which suggests a theoretical basis for representing, e.g., providing, a reduced, e.g., narrow, FWHM. However, quantum dots having a coated ZnTeSe-based core and high luminescence properties have not been previously reported. Herein, the expression "cadmium-free quantum dots" or "not including" a specific element means that a concentration of cadmium or a specific element in the quantum dots is, for example, less than or equal to about 50 ppm, or less than or equal to about 10 ppm, or about 0 ppm.

The inventors have surprisingly produced a cadmium-free quantum dot having a core-shell structure including a ZnTeSe-based core and an emission peak wavelength, e.g., a wavelength of a maximum emission peak of the quantum dot, in the range of greater than or equal to about 500 nm and less than or equal to about 550 nm, exhibiting higher, e.g., desirable, quantum efficiency (QY), and having an emission peak, e.g., maximum emission peak, having a narrower FWHM. Quantum dots according to an embodiment include a core including a first semiconductor nanocrystal including zinc, selenium, and tellurium, and a semiconductor nanocrystal shell disposed on at least a portion of the core and including zinc, and selenium, sulfur, or a combination thereof, wherein a ratio of a mole number of tellurium relative to a mole number of selenium, e.g., a mole ratio of tellurium relative to selenium, in the first semiconductor nanocrystal is greater than about 1:1, a ratio of a sum of mole numbers of selenium and sulfur relative to a mole number of tellurium, e.g., a mole ratio of a sum of selenium and sulfur tellurium relative to tellurium, in the quantum dot is greater than about 1:1. That is, the quantum dots according to an embodiment may have a quantum efficiency (QY) of greater than or equal to about 30%, and a FWHM of the emission peak may be less than or equal to about 30 nm.

The quantum dot of an embodiment may have significantly improved quantum efficiency compared with quantum dots emitting green light based on a, e.g., including, ZnSeTe core. The quantum dot of an embodiment may have a quantum efficiency of, for example, greater than or equal to about 31%, greater than or equal to about 32%, greater than or equal to about 33%, greater than or equal to about 34%, greater than or equal to about 35%, greater than or equal to about 36%, greater than or equal to about 37%, greater than or equal to about 38%, greater than or equal to about 39%, greater than or equal to about 40%, greater than or equal to about 41%, greater than or equal to about 42%, greater than or equal to about 43%, greater than or equal to about 44%, greater than or equal to about 45%, greater than or equal to about 46%, greater than or equal to about 47%, greater than or equal to about 49%, or greater than or equal to about 50%, but is not limited thereto.

In addition, the FWHM of less than or equal to about 30 nm of the emission peak of the quantum dots according to an embodiment may also be significantly improved compared with the FWHM of the emission peak of quantum dots emitting green light based on a ZnSeTe core. For example, the FWHM of the emission peak may be less than or equal to about 29.7 nm, less than or equal to about 29.5 nm, less than or equal to about 29.3 nm, less than or equal to about 29 nm, less than or equal to about 28.7 nm, less than or equal to about 28.5 nm, less than or equal to about 28 nm, or less than or equal to about 27.7 nm.

The quantum dots according to an embodiment have high quantum efficiency and the emission peak of the quantum dots may be narrow as described herein, so that the quantum dot may exhibit high luminance and color purity. Accordingly, the quantum dot may be used as, e.g., in, a color conversion layer of a display or included in a light emitting layer of an electroluminescent device to implement a high color reproduction display.

The quantum dots according to an embodiment may have a maximum emission peak wavelength in the range of greater than or equal to about 500 nm and less than or equal to about 550 nm, and may emit green light, for example, in the range of greater than or equal to about 500 nm and less than or equal to about 545 nm, greater than or equal to about 505 nm and less than or equal to about 545 nm, greater than or equal to about 500 nm and less than or equal to about 540 nm, greater than or equal to about 505 nm and less than or equal to about 535 nm, or greater than or equal to about 510 nm and less than or equal to about 535 nm.

ZnTeSe-based quantum dots may emit green light having a quantum efficiency of less than about 10%, e.g., about 1%, a FWHM of greater than about 30 nm, an emission peak wavelength of greater than 530 nm, for example, in a long wavelength region of about 530 nm to about 600 nm, about 540 nm to about 590 nm, or about 550 nm to about 585 nm, or a combination thereof. Accordingly, luminescence properties of ZnTeSe-based quantum dots may not be good. On the other hand, the quantum dots according to an embodiment exhibits excellent luminescence properties as described herein.

A mole ratio of tellurium relative to selenium in the first semiconductor nanocrystal of the quantum dots according to an embodiment may be greater than about 1:1. For example, the mole ratio of tellurium relative to selenium may be greater than or equal to about 1.1:1, greater than or equal to about 1.2:1, greater than or equal to about 1.3:1, greater than or equal to about 1.5:1, greater than or equal to about 1.7:1, greater than or equal to about 2:1, greater than or equal to about 2.3:1, greater than or equal to about 2.5:1, greater than or equal to about 2.7:1, greater than or equal to about 3:1, greater than or equal to about 3.5:1, greater than or equal to about 4:1, or greater than or equal to about 5:1, but is not limited thereto. The mole ratio of tellurium relative to selenium in the first semiconductor nanocrystal of the quantum dots according to an embodiment may be less than or equal to about 9:1, for example, less than or equal to about 8:1, less than or equal to about 7:1, or less than or equal to about 6:1, but is not limited thereto.

In an embodiment, the first semiconductor nanocrystal of the quantum dots according to an embodiment may include $ZnTe_xSe_{1-x}$, wherein x may be greater than about 0.5, for example, greater than or equal to about 0.51, greater than or equal to about 0.52, greater than or equal to about 0.53, greater than or equal to about 0.54, greater than or equal to about 0.55, greater than or equal to about 0.56, greater than or equal to about 0.57, greater than or equal to about 0.58, greater than or equal to about 0.59, greater than or equal to about 0.6, greater than or equal to about 0.61, greater than or equal to about 0.62, greater than or equal to about 0.63, greater than or equal to about 0.64, greater than or equal to about 0.65, greater than or equal to about 0.66, greater than or equal to about 0.67, greater than or equal to about 0.68, greater than or equal to about 0.69, greater than or equal to about 0.70, greater than or equal to about 0.71, greater than or equal to about 0.72, greater than or equal to about 0.73, greater than or equal to about 0.74, or greater than or equal to about 0.75, and less than or equal to about 0.9, less than or equal to about 0.89, less than or equal to about 0.88, less than or equal to about 0.87, less than or equal to about 0.86, less than or equal to about 0.85, less than or equal to about 0.84, less than or equal to about 0.83, less than or equal to about 0.82, or less than or equal to about 0.8. When x is within the disclosed range, the emission peak wavelength of the quantum dots according to an embodiment may be in the range of greater than or equal to about 500 nm and less than or equal to about 550 nm.

In the quantum dots according to an embodiment, a ratio of mole number of ((Se+S):Te), i.e., of a sum of mole numbers of selenium and sulfur relative to a mole number of tellurium in the entire quantum dots may be greater than about 1:1, and for example, the ratio may be greater than or equal to about 1.1:1, greater than or equal to about 1.2:1, greater than or equal to about 1.3:1, greater than or equal to about 1.4:1, greater than or equal to about 1.5:1, greater than or equal to about 1.6:1, greater than or equal to about 1.7:1, greater than or equal to about 1.8:1, greater than or equal to about 1.9:1, greater than or equal to about 2:1, greater than or equal to about 2.1:1, greater than or equal to about 2.2:1, greater than or equal to about 2.3:1, greater than or equal to about 2.4:1, greater than or equal to about 2.5:1, greater than or equal to about 2.6:1, greater than or equal to about 2.7:1, greater than or equal to about 2.8:1, greater than or equal to about 2.9:1 or greater than or equal to about 3:1, but is not limited thereto.

In addition, in the quantum dots according to an embodiment, a ratio of a mole number of zinc to a sum of mole numbers of selenium and sulfur may be greater than or equal to about 1:1, for example, greater than or equal to about 1.1:1, greater than or equal to about 1.2:1, greater than or equal to about 1.3:1, greater than or equal to about 1.4:1, greater than or equal to about 1.5:1, greater than or equal to about 1.6:1, greater than or equal to about 1.7:1, greater than or equal to about 1.8:1, greater than or equal to about 1.9:1, or greater than or equal to about 2.0:1, but is not limited thereto.

Contents of the components in the quantum dots according to an embodiment may be confirmed through an appropriate analysis means, for example, inductively coupled plasma atomic emission spectroscopy (ICP-AES), X-ray photoelectron spectroscopy (XPS), and the like.

When the quantum dots according to an embodiment have the disclosed ratio of the mole numbers of selenium and tellurium in the first semiconductor nanocrystal, the disclosed ratio of the mole numbers of the sum of selenium and sulfur relative to tellurium, the disclosed ratio of the mole numbers of zinc relative to the sum of mole numbers of selenium and sulfur in the entire quantum dot, or a combination thereof, the radius of the core of the quantum dots may be less than or equal to about 2 nm, for example, less than or equal to about 1.9 nm, less than or equal to about 1.8 nm, less than or equal to about 1.7 nm, less than or equal to about 1.6 nm, less than or equal to about 1.5 nm, less than or equal to about 1.4 nm, less than or equal to about 1.3 nm, less than or equal to about 1.2 nm, less than or equal to about 1.1 nm, or less than or equal to about 1 nm, but is not limited thereto. In addition, when the radius of the core of the quantum dots according to the embodiment is in the range, the thickness of the shell of the quantum dot may be about 1 monolayer (ML) or more, about 2 ML or more, about 3 ML or more, about 4 ML or more, about 5 ML or more, about 6 ML or more, about 7 ML or more, about 8 ML or more, about 9 ML or more, or about 10 ML or more, but is not limited thereto.

When the quantum dots according to an embodiment have a radius of the core within the disclosed ranges and includes the semiconductor nanocrystal shell having a thickness of 1 monolayer or more on the core, the quantum dots may have a maximum emission peak wavelength in the range of about 500 nm to about 550 nm and may also maintain FWHM of less than or equal to about 30 nm.

As described herein, ZnTeSe core-based quantum dots have a small difference in emission wavelength depending on the particle size distribution, e.g., the wavelength of the maximum emission peak varies little with a change in particle size, thus providing a theoretical basis for reducing, e.g., decreasing, the FWHM. However, a ZnTeSe-based quantum dot emitting green light and having substantially high luminescence properties have not been previously reported, and previous research has focused on controlling a range of the emission wavelength by adjusting a size of the core, and also mainly focused on controlling a range of the total particle diameters of quantum dots for ensuring a shell thickness essential to stabilize the quantum dot structure.

The present inventors have established an effective mass approximation (EMA) map (or isometric line graph) expressing an isometric line and a color for which quantum dots emit light at the same wavelength, wherein the x-axis refers to a core radius of the quantum dots, and the y-axis refers to a shell thickness, as the result of calculating EMA for ZnTeSe-based quantum dots; have produced quantum dots having the same total particle diameter range but different core radii and shell thicknesses from each other; and have performed an experiment for finding which structure is effective to provide a higher quantum efficiency, a lower, e.g., narrower, FWHM, or a combination thereof, according to, e.g., by, changing a core radius and a shell thickness in the EMA map. As a result, an appropriate core size of a quantum dot for providing a shell coating thick enough to ensure stability may be provided. A variable range of a core radius, a shell thickness, or a combination thereof of a quantum dot capable of showing, e.g., exhibiting, the same emission wavelength may be provided, and resultantly, the produced quantum dot may be a high efficient cadmium-free ZnTeSe-based quantum dot having a narrower FWHM at the emission peak. Hereinafter, a method of predicting an emission wavelength change and a FWHM change of quantum dots depending upon changes of a core radius and a shell thickness of ZnTeSe-based quantum dots using the EMA map with reference to the figures will be described in detail.

Figure 1B:
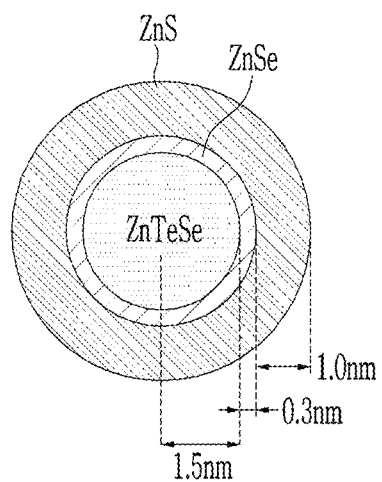

FIGS. 1A and 1B are schematic views showing cross-sections of two quantum dots having the same particle diameter produced for the disclosed experiments, but having different core radii and shell thicknesses.

Specifically, referring to FIGS. 1A and 1B, FIG. 1A is a cross-sectional view of a quantum dot showing that the radius of the core including ZnTeSe is about 2.2 nm, the thickness of the shell including ZnSe disposed directly on the core is about 0.3 nm, the thickness of a ZnS shell disposed on the ZnSe shell is about 0.3 nm, and thus a total particle diameter is about 5.6 nm. Meanwhile, FIG. 1B is a cross-sectional view of a quantum dot showing that the radius of the core including ZnTeSe is about 1.5 nm, the thickness of the shell including ZnSe disposed directly on the core is about 0.3 nm, the thickness of the ZnS shell disposed on the ZnSe shell is about 1.0 nm, and thus, a total particle diameter of the quantum dot is about 5.6 nm, which is the same as that of FIG. 1A.

Figure 2:
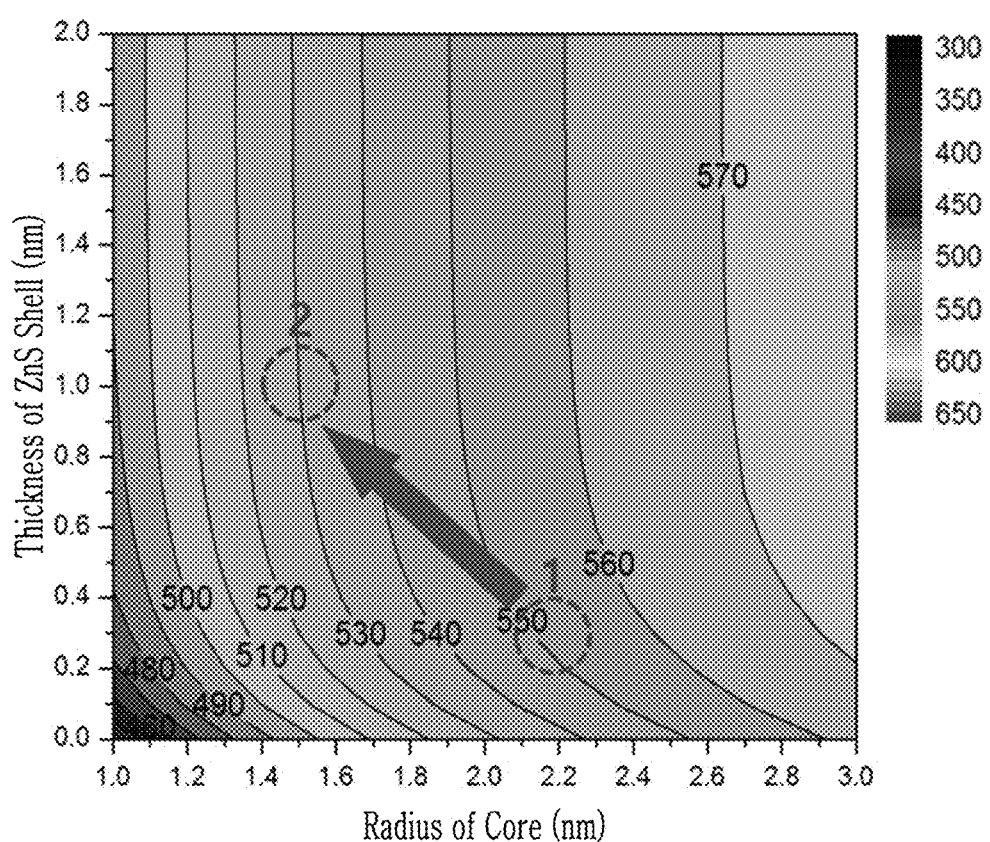
FIG. 2 is an isometric line graph of emission wavelengths according to the ZnS shell thickness (nm) versus the core radius (nm) of a ZnTeSe/ZnSe/ZnS core-shell quantum dot having a ZnTeSe core and a 0.3 nm-thick ZnSe shell disposed on the core.

FIG. 2 is an EMA map expressing an isometric line and a color for quantum dots emitting light at the same wavelength, e.g., maximum emission peak wavelength, in the EMA calculation results, wherein the x-axis refers to a core radius of quantum dot, and the y-axis refers to a ZnS shell thickness for the quantum dots having a thickness of the ZnSe shell of about 0.3 nm and a total particle diameter of about 5.6 nm, as in two quantum dots shown in FIG. 1. The circle marked with "1" in the map represents a position of the quantum dot of FIG. 1A which has a core radius of about 2.2 nm and a ZnS shell thickness of about 0.3 nm; and the circle marked with "2" represents a position of the quantum dot of FIG. 1B which has a core radius of about 1.5 nm and a ZnS shell thickness of about 1.0 nm.

As shown in FIG. 2, when quantum dot is positioned in the circle marked with "1", that is, when the core radius is relatively high as about 2.2 nm, the slope of the isometric line is less than an absolute value 1 and very steep, meaning that the wavelength is changed greatly so that the increase in the FWHM would be very large due to non-uniformity of size of the quantum dots. In addition, it is understood that the emission wavelength is positioned outside the range of green light emission of a display, but belong to a deep green light emission region. On the other hand, in a case of the circle marked with "2", which is a quantum dot having a core of a relatively small radius of about 1.5 nm, the slope of the isometric line is greater than an absolute value 1, and the slope converges infinitely, e.g., approaches infinity, as the ZnS shell thickness increases. In this case, it is noted that the FWHM rarely, e.g., barely, changes even when non-uniformity of size of quantum dots occurs by increasing or decreasing a thickness of the shell. That is, the region is a region in which a shell may be more thickly coated, such that reliability and stability of quantum dots can be expected, and corresponding to a green light emitting region of a display.

This tendency is preserved even when the thickness of ZnSe shell increases up to about 0.5 nm. In other words, FIG. 3 shows the EMA map for the two quantum dots of FIG. 1A and FIG. 1B when only the thicknesses of the ZnSe shells of the two quantum dots are increased to 0.5 nanometers, and in the EMA map the positions of the two quantum dots are referred as circles marked as "1" and "2", respectively.

Figure 3:
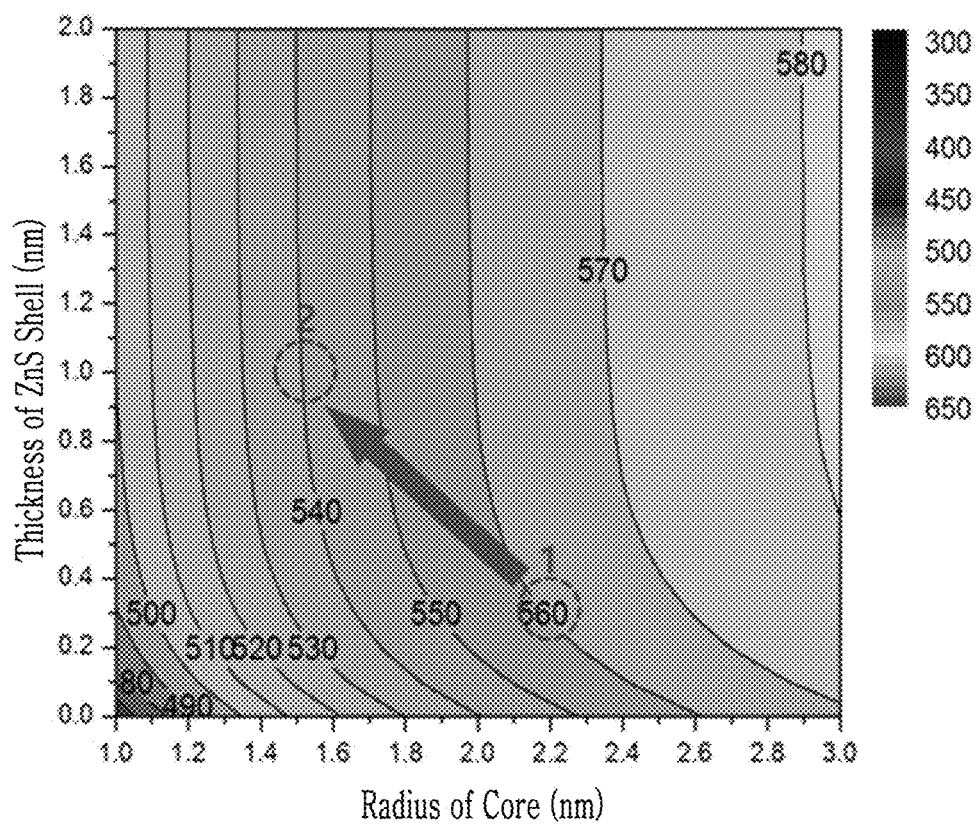
FIG. 3 is an isometric line graph of emission wavelengths according to the ZnS shell thickness (nm) versus the core radius (nm) of a ZnTeSe/ZnSe/ZnS core-shell quantum dot having a ZnTeSe core and a 0.5 nm-thick ZnSe shell disposed on the core.

Referring to FIG. 3, the quantum dot in Position 1 having a core of 2.2 nm and a ZnS shell thickness of about 0.3 nm emits light in a deep green region of about 560 nm, and in this case, a slope of the corresponding isometric line is also less than an absolute value 1 and very steep. Accordingly, it is estimated that the increase in FWHM of a maximum emission peak of the quantum dot would be significant as the wavelength, e.g., maximum emission peak wavelength, changes greatly due to non-uniformity of size of the quantum dot. On the other hand, the quantum dot of Position 2 having a core of about 1.5 nm and a ZnS shell thickness of 1 nm emits light in a green light emitting region of about 540 nm, and an absolute value of the slope of the corresponding isometric line is about 1. Thus, in the corresponding quantum dot, the FWHM rarely, e.g., barely, increases due to non-uniformity of size of the quantum dot even if a thickness of the ZnS shell further increases, and the corresponding light emitting region belongs to a green light emitting region. Thereby, a thicker shell coating in the circle region marked "2" may be provided, and reliability and stability of quantum dots may be improved.

Figure 4:
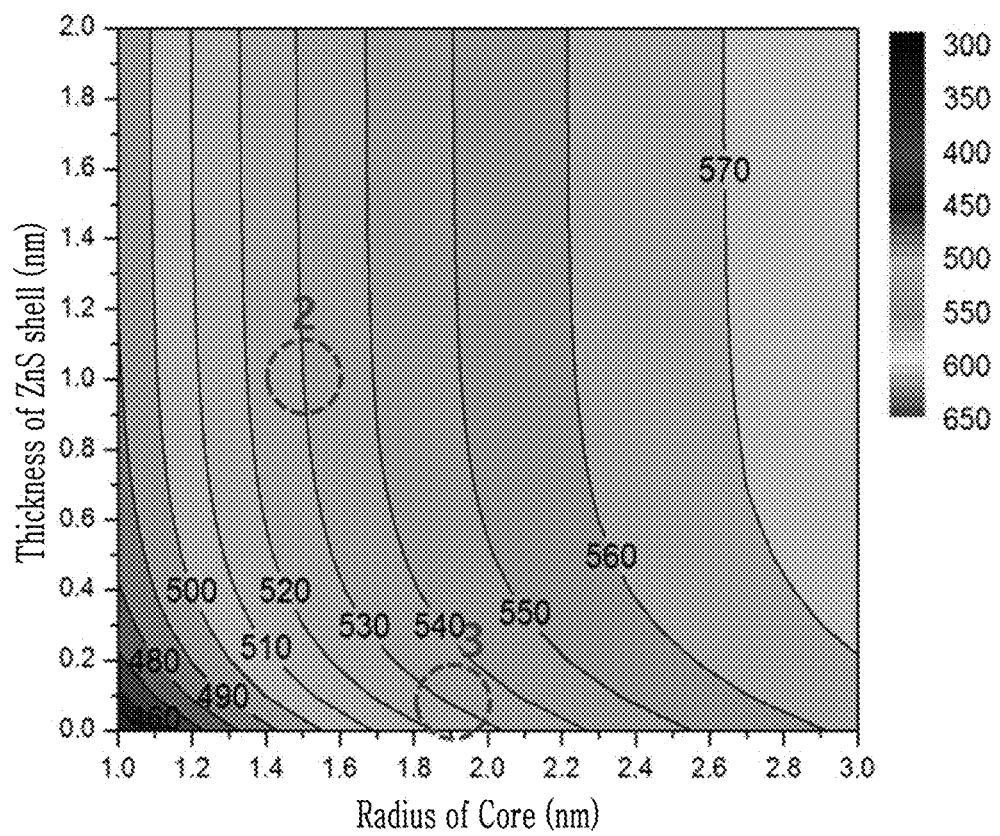
FIG. 4 is a simulation graph for predicting the structure of a quantum dot having the same emission wavelengths in the isochromic line graph of FIG. 2.

Meanwhile, FIG. 4 is a view of, e.g., for, predicting a structure of quantum dot capable of emitting light at about 530 nm using the EMA map shown in FIG. 2. The circle marked as "2" in FIG. 4 refers to the same quantum dot as the quantum dot represented by the circle marked to "2" in the map of FIG. 2, which is quantum dot having a core of about 1.5 nm, a ZnSe shell of about 0.3 nm, a ZnS shell of about 1 nm, and the total size (e.g., diameter) of about 5.6 nm, and it is understood that it may emit light at about 530 nm. On the other hand, the circle marked as "3" refers to a quantum dot having a core radius of about 1.9 nm, the ZnSe shell thickness of about 0.3 nm, which is same as that of quantum dot in the circle marked as "2". In this case, it is understood that the thickness of the ZnS shell may be about 0.1 nm in order for the quantum dot to emit light at about 530 nm.

As shown in FIG. 4, it is understood that the thickness of the ZnS shell capable of being coated for emitting light in the same light emitting region, for example, at about 530 nm may be decreased as the core radius of quantum dot is increased in a range from about 1.5 nm to about 2.0 nm. Thus, in order for the quantum dot to be coated with a shell thick enough to emit light in a desired light emitting region and to ensure stability of the quantum dot, the core of the corresponding quantum dot may satisfy a predetermined size level, so thereby, an optimal structure of the ZnTeSe-based quantum dot may be derived, and the effects, e.g., the wavelength of the maximum emission peak, may be verified through an experiment. In order for the quantum dots to have an appropriate sized core and thereby shell thickness, a ratio of a mole number of tellurium relative to a mole number of selenium in the first semiconductor nanocrystal for forming the core may be greater than about 1:1, and a ratio of a sum of mole numbers of selenium and sulfur relative to a mole number of tellurium may be greater than about 1:1.

On the other hand, the quantum dots according to an embodiment may have an appropriately sized radius of the core and thickness of the shell. For example, an average particle size (e.g., diameter) of the quantum dots may be greater than or equal to about 3 nm, for example, greater than or equal to about 3.5 nm, greater than or equal to about 4 nm, greater than or equal to about 5 nm, greater than or equal to about 6 nm, greater than or equal to about 7 nm, or greater than or equal to about 8 nm, but is not limited thereto. In addition, the average particle size (e.g., diameter) of quantum dots according to an embodiment may be less than or equal to about 50 nm, for example, less than or equal to about 45 nm, less than or equal to about 40 nm, less than or equal to about 35 nm, less than or equal to about 30 nm, less than or equal to about 25 nm, less than or equal to about 24 nm, less than or equal to about 23 nm, less than or equal to about 22 nm, less than or equal to about 21 nm, less than or equal to about 20 nm, less than or equal to about 19 nm, less than or equal to about 18 nm, less than or equal to about 17 nm, less than or equal to about 16 nm, less than or equal to about 15 nm, less than or equal to about 14 nm, less than or equal to about 13 nm, less than or equal to about 12 nm, less than or equal to about 11 nm, or less than or equal to about 10 nm, but is not limited thereto. Herein, the average particle size of the quantum dots may mean a diameter, or a diameter calculated by assuming a sphere from a two-dimensional electron microscope image of the quantum dot when the quantum dot is not spherical. As used herein, an "average particle size" of a quantum dot may mean the particle size of a single quantum dot or an average of multiple quantum dots, if present.

In the quantum dot of an embodiment, the semiconductor nanocrystal shell may include zinc, and selenium, sulfur, or a combination thereof. The semiconductor nanocrystal shell may include ZnSe, ZnS, ZnSeS, or a combination thereof. The shell may be a multi-layered shell including a plurality of layers. Layers adjacent to each other in the plurality of layers may include semiconductor materials having different compositions. The multi-layered shell may include a first layer disposed directly on the core, and a second layer disposed on the first layer. The first layer may include a second semiconductor nanocrystal. The second layer may include a third semiconductor nanocrystal having a composition different from that of the second semiconductor nanocrystal. The second layer may be an outermost layer of the quantum dot. The second semiconductor nanocrystal may include zinc, selenium, and optionally sulfur. The third semiconductor nanocrystal may include zinc and sulfur. In an embodiment, the third semiconductor nanocrystal may not include selenium.

In the case of the multi-layered shell, the thickness of each layer may be appropriately selected. Each layer may have a thickness of about 1 monolayer or more, for example, about 2 ML or more, about 3 ML or more, 4 ML or more, 5 ML or more and about 10 ML or less, for example, about 9 ML or less, about 8 ML or less, about 7 ML or less, about 6 ML or less, or about 5 ML or less. In the multi-layered shell, the thickness of each layer may be determined taking into consideration the composition of the entire quantum dot.

In an embodiment, the quantum dots may include a ZnSe layer, a ZnSeS layer, a ZnS layer, or a combination thereof, which is disposed directly on the aforementioned core. The quantum dot may have a layer made of ZnS on the outermost surface.

In the shell or multi-layered shell, each layer may include a gradient alloy having a composition that changes, e.g., varies, in a radial direction. In an embodiment, the content of sulfur in the semiconductor nanocrystal shell may increase in a direction toward the surface of the quantum dot. For example, in the shell, the content of sulfur may have a concentration gradient that increases as the distance from the core increases, e.g., in a direction away from the core and toward the surface of the quantum dot.

The quantum dots may include organic ligands on the surfaces. The organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', $RPO(OH)_2$, RHPOOH, RHPOOH (wherein, R and R' independently include a C1 to C40, for example, a C3 to C30 or a C6 to C24 substituted or unsubstituted aliphatic hydrocarbon group, or a C6 to C40 substituted or unsubstituted aromatic hydrocarbon group, or a combination thereof), or a combination thereof. The organic ligand may be used alone or in a mixture of two or organic ligands.

Examples of the organic ligand may be methane thiol, ethane thiol, propane thiol, butane thiol, pentane thiol, hexane thiol, octane thiol, dodecane thiol, hexadecane thiol, octadecane thiol, benzyl thiol; methane amine, ethane amine, propane amine, butane amine, pentane amine, hexane amine, octane amine, dodecane amine, hexadecyl amine, oleyl amine, octadecyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, palmitic acid, and stearic acid; a phosphine such as methyl phosphine, ethyl phosphine, propyl phosphine, butyl phosphine, pentyl phosphine, tributylphosphine, and trioctylphosphine; a phosphine compound or an oxide compound thereof such as methyl phosphine oxide, ethyl phosphine oxide, propyl phosphine oxide, butyl phosphine oxide, and trioctylphosphine oxide; a diphenyl phosphine, triphenyl phosphine compound or an oxide compound thereof; or phosphonic acid, but are not limited thereto. The organic ligand may be used alone or in a mixture of two or more organic ligands.

In an embodiment, the organic ligand may be a combination of RCOOH and an amine (e.g., $RNH_2$, $R_2NH$, $R_3N$, or a combination thereof). In an embodiment, the organic ligand may not include glutathione. The quantum dots may be water insoluble. Cadmium-free quantum dots, when dispersed in water, may exhibit an average particle diameter of greater than or equal to about 300 nm in dynamic light scattering analysis. Cadmium-free quantum dots may be dispersed in an organic solvent to form a quantum dot organic solution having an average particle diameter of less than or equal to about 500 nm, less than or equal to about 400 nm, or less than or equal to about 300 nm in a dynamic light scattering analysis. The organic solvent is the same as described herein.

The quantum dots according to an embodiment may be produced using various methods of producing quantum dots and such a production method is not particularly limited. For example, the quantum dots may be produced through a wet method that includes reacting precursor compounds of semiconductor nanocrystals forming the core and shell of the quantum dot in an organic solvent to produce colloidal quantum dots. Such a wet method of producing the quantum dots according to an embodiment may include: preparing a core including a first semiconductor nanocrystal including zinc, selenium, and tellurium; and reacting a zinc precursor and a, e.g., at least one, non-metallic precursor such as a selenium precursor and a sulfur precursor at a shell formation temperature in an organic solvent, in the presence of the core and the organic ligand, so that a semiconductor nanocrystal shell including zinc and selenium, sulfur, or a combination thereof are formed on the surface of the core.

The forming of the semiconductor nanocrystal shell may include reacting the zinc precursor with the selenium precursor, and then reacting the zinc precursor with the sulfur precursor.

Details of the core are the same as described herein. In an embodiment, the core may be obtained by preparing a zinc precursor solution including a zinc precursor and an organic ligand; preparing a selenium precursor and a tellurium precursor; heating the zinc precursor solution to a core formation reaction temperature, and optionally adding the selenium precursor and the tellurium precursor thereto together with an organic ligand to proceed with the reaction, wherein a content of the tellurium precursor is included in a greater amount than that of the selenium precursor. For example, the tellurium precursor may be reacted in a larger amount, e.g., ratio, of less than or equal to about 10 moles, for example, less than or equal to about 9 moles, or less than or equal to about 8 moles per 1 mole of the selenium precursor, and in addition, the tellurium precursor may be reacted in a larger amount, e.g., ratio, of greater than or equal to about 2 moles, for example, greater than or equal to about 3 moles, greater than or equal to about 4 moles, or greater than or equal to about 5 moles per 1 mole of the selenium precursor. By reacting them in this way, a core of a quantum dot having a ratio of a mole number of tellurium relative to a mole number of selenium of greater than about 1:1 in the first semiconductor nanocrystal forming the core of the quantum dot according to an embodiment may be produced.

A radius of the core of the quantum dot produced as described herein may be less than or equal to about 2 nm, for example, less than or equal to about 1.8 nm, less than or equal to about 1.7 nm, less than or equal to about 1.6 nm, less than or equal to about 1.5 nm, less than or equal to about 1.4 nm, less than or equal to about 1.3 nm, less than or equal to about 1.2 nm, less than or equal to about 1.1 nm, or less than or equal to about 1 nm. The radius of the core may be easily controlled by adjusting a reaction time for producing the core of the quantum dot.

On the other hand, in forming the semiconductor nanocrystal shell on the core produced as described herein, contents of the selenium precursor and the sulfur precursor for forming the semiconductor nanocrystal shell may be adjusted so that a ratio of a sum of mole numbers of selenium and sulfur relative to a mole number of tellurium in the quantum dot according to an embodiment may be greater than about 1:1.

The zinc precursor may include a Zn metal powder, ZnO, an alkylated Zn compound (e.g., a C2 to C30 dialkyl zinc such as diethyl zinc), a Zn alkoxide (e.g., a zinc ethoxide), a Zn carboxylate (e.g., a zinc acetate), a Zn nitrate, a Zn perchlorate, a Zn sulfate, a Zn acetylacetonate, a Zn halide (e.g., a zinc chloride), a Zn cyanide, a Zn hydroxide, or a combination thereof. Examples of the zinc precursor may be dimethylzinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, or a combination thereof.

The selenium precursor may include selenium-trioctylphosphine (Se-TOP), selenium-tributylphosphine (Se-TBP), selenium-triphenylphosphine (Se-TPP), selenium-diphenylphosphine (Se-DPP), or a combination thereof, but is not limited thereto.

The tellurium precursor may include tellurium-trioctylphosphine (Te-TOP), tellurium-tributylphosphine (Te-TBP), tellurium-triphenylphosphine (Te-TPP), or a combination thereof, but is not limited thereto.

The sulfur precursor may include hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-trioctylamine (S-TOA), sulfur-octadecene (S-ODE), bistrimethylsilyl sulfur, ammonium sulfide, sodium sulfide, or a combination thereof, and is not limited thereto.

The organic solvent may include a C6 to C22 primary amine such as hexadecyl amine, a C6 to C22 secondary amine such as a dioctyl amine, a C6 to C40 tertiary amine such as a trioctyl amine, a nitrogen-containing heterocyclic compound such as pyridine, a C6 to C40 olefin such as octadecene, a C6 to C40 aliphatic hydrocarbon group such as hexadecane, octadecane, or squalane, an aromatic hydrocarbon group substituted with a C6 to C30 alkyl group such as phenyldodecane, phenyltetradecane, or phenyl hexadecane, a primary, secondary, or tertiary phosphine (e.g., trioctyl amine) substituted with at least one (e.g., 1, 2, or 3) C6 to C22 alkyl group, a phosphine oxide (e.g., trioctylphosphine oxide) such as (e.g., 1, 2, or 3) substituted with a C6 to C22 alkyl group, a C12 to C22 aromatic ether such as a phenyl ether, a benzyl ether, or a combination thereof.

The organic ligand may coordinate, e.g., be bound to, the surface of the produced nanocrystals, and may have an effect on the light emitting and electrical characteristics as well as aid dispersion of the nanocrystals in the solution phase. Details of the organic ligand are the same as described herein.

A reaction temperature for forming the core of the quantum dot may be greater than or equal to about 280° C., greater than or equal to about 290° C., greater than or equal to about 300° C., or greater than or equal to about 310° C. and less than or equal to about 350° C., for example, less than or equal to about 340° C. The reaction time for forming the core is not particularly limited and may be appropriately selected.

The reaction conditions, such as reaction temperature and time for forming the shell of the quantum dot, may be appropriately selected taking into consideration a desired shell composition. In an embodiment, the solvent and optionally, the organic ligand are heated (or vacuumed) at a predetermined temperature (e.g., at greater than or equal to about 100° C.) under vacuum and heated again at a predetermined temperature (e.g., greater than or equal to 100° C.) and changing to an inert gas atmosphere. Subsequently, the core is added, and the shell precursors may be sequentially or simultaneously added and reacted by heating at a predetermined reaction temperature. The shell precursors may be sequentially added for a reaction time as a mixture having a different ratio to form a shell of a desired composition (e.g., having a gradient or multiple layers). In an embodiment, a zinc precursor and a selenium precursor are reacted to form a first layer of the shell, and then, a zinc precursor and a sulfur precursor are reacted to form a second layer of the shell. A reaction temperature for forming the shell may be greater than or equal to about 280° C., for example, greater than or equal to about 290° C., or greater than or equal to about 300° C., and less than or equal to about 330° C., or less than or equal to about 325° C.

A content and a concentration of each precursor in the reaction system may be selected taking into consideration a desired core and shell composition and a reactivity between the precursors. For example, taking into consideration the desired composition (Zn, S, Se) of the final quantum dot, a ratio between each precursor may be adjusted. A composition of the final quantum dots may be confirmed by appropriate analysis means such as inductively coupled plasma atomic emission spectroscopy.

After completion of the reaction, when a nonsolvent is added to the reaction product, nanocrystal particles coordinated with, e.g., bound to, the ligand compound may be separated. The nonsolvent is miscible with the solvent used in the core formation reaction, shell formation reaction, or a combination thereof, but may be a polar solvent that is not capable of dispersing produced nanocrystals. The nonsolvent may be selected depending the solvent used in the reaction and may be for example acetone, ethanol, butanol, isopropanol, ethanediol, water, tetrahydrofuran (THF), dimethylsulfoxide (DMSO), diethyl ether, formaldehyde, acetaldehyde, ethylene glycol, a solvent having a similar solubility parameter to the foregoing solvents, or a combination thereof. The separation may be performed by centrifugation, precipitation, chromatography, or distillation. Separated nanocrystals may be washed by adding to a washing solvent as desired. The washing solvent has no particular limit and may have a similar solubility parameter to that of the ligand and may, for example, include hexane, heptane, octane, chloroform, toluene, benzene, and the like.

A quantum dot-polymer composite according to an embodiment includes a polymer matrix and quantum dots according to an embodiment dispersed in the polymer matrix.

The polymer matrix may include a binder polymer, a polymerization product of a (photo) polymerizable monomer including 1 or more, for example, 2 or more, 3 or more, 4 or more, or 5 or more carbon-carbon unsaturated bonds, and optionally a polymerization product between the (photo) polymerizable monomer and a multi-thiol compound having at least two thiol groups at a terminal end thereof. In an embodiment, the polymer matrix may include a crosslinked polymer and optionally a carboxy group-containing binder polymer. The crosslinked polymer may include a thiolene resin, a crosslinked poly(meth)acrylate, or a combination thereof. In an embodiment, the crosslinked polymer may be a polymerization product of the (photo) polymerizable monomer, and optionally a multi-thiol compound.

The binder polymer may include a carboxylic acid group. The binder polymer may be a copolymer of a monomer mixture including a first monomer including a carboxylic acid group and a carbon-carbon double bond, a second monomer having a carbon-carbon double bond and a hydrophobic moiety and not having a carboxylic acid group, and optionally a third monomer having a carbon-carbon double bond and a hydrophilic moiety and not having a carboxylic acid group; a multiple aromatic ring-containing polymer including a carboxylic acid group (—COON) and having a backbone structure wherein two aromatic rings are bound to a quaternary carbon atom being a constituent atom of another cyclic moiety in the main chain; or a combination thereof.

The (photo) polymerizable monomer including 1 or more, for example, 2 or more, 3 or more, 4 or more, or 5 or more carbon-carbon unsaturated bonds may include the (meth) acryl-based monomer. Examples of the (meth)acryl-based monomer may include a C1-C10 alkyl(meth)acrylate, ethylene glycol di(meth)acrylate, triethylene glycol di(meth) acrylate, diethylene glycol di(meth)acrylate, 1,4-butanediol di(meth)acrylate, 1,6-hexanediol di(meth)acrylate, neopentyl glycol di(meth)acrylate, pentaerythritol di(meth)acrylate, pentaerythritol tri(meth)acrylate, pentaerythritol tetra(meth)acrylate, dipentaerythritol di(meth)acrylate, dipentaerythritol tri(meth)acrylate, dipentaerythritol penta(meth)acrylate, pentaerythritol hexa(meth)acrylate, bisphenol A di(meth) acrylate, bisphenol A epoxy acrylate, trimethylolpropane tri(meth)acrylate, ethylene glycol monomethyl ether (meth) acrylate, novolac epoxy (meth)acrylate, diethylene glycol di(meth)acrylate, triethylene glycol di(meth)acrylate, propylene glycol di(meth)acrylate, tris(meth)acryloyloxy ethyl phosphate, or a combination thereof.

The multi-thiol compound may include a compound represented by Chemical Formula 1:

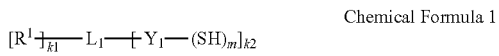

Chemical Formula 1

In Chemical Formula 1, $R^1$ is hydrogen; a substituted or unsubstituted C1 to C30 linear or branched alkyl group; a substituted or unsubstituted C6 to C30 aryl group; a substituted or unsubstituted C7 to C30 arylalkyl group; a substituted or unsubstituted C3 to C30 heteroaryl group; a substituted or unsubstituted C4 to C30 heteroarylalkyl group; a substituted or unsubstituted C3 to C30 cycloalkyl group; a substituted or unsubstituted C3 to C30 heterocycloalkyl group; a C1 to C10 alkoxy group; a hydroxy group; –NH$_2$; a substituted or unsubstituted C1 to C30 amine group (—NRR', wherein R and R' are independently hydrogen or a C1 to C30 linear or branched alkyl group, and both are not hydrogen at the same time); an isocyanate group; a halogen; —ROR' (wherein R is a substituted or unsubstituted C1 to C20 alkylene group and R' is hydrogen or a C1 to C20 linear or branched alkyl group); an acyl halide (—RC(=O)X, wherein R is a substituted or unsubstituted alkylene group and X is a halogen); —C(=O) OR' (wherein R' is hydrogen or a C1 to C20 linear or branched alkyl group); —CN; —C(=O)NRR', or —C(=O) ONRR' (wherein R and R' are independently hydrogen or a C1 to C20 linear or branched alkyl group), $L_1$ is a carbon atom, a substituted or unsubstituted C1 to C30 alkylene group, a substituted or unsubstituted C3 to C30 cycloalkylene group, a substituted or unsubstituted C6 to C30 arylene group, or a substituted or unsubstituted C3 to C30 heteroarylene group, wherein methylene (—CH$_2$—) of the substituted C1 to C30 alkylene group may be replaced by sulfonyl (—SO$_2$—), carbonyl (CO), ether (—O—), sulfide (—S—), sulfoxide (—SO—), ester (—C(=O)O—), amide (—C(=O)NR—) (wherein R is hydrogen or a C1 to C10 alkyl group) or a combination thereof, $Y_1$ is a single bond; a substituted or unsubstituted C1 to C30 alkylene group; a substituted or unsubstituted C2 to C30 alkenylene group; or a C1 to C30 alkylene group or a C2 to C30 alkenylene group wherein a, e.g., at least one, methylene (—CH$_2$—) is replaced by sulfonyl (—S(=O)$_2$—), carbonyl (—C(=O)—), ether (—O—), sulfide (—S—), sulfoxide (—S(=O)—), ester (—C(=O) O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, m is an integer of 1 or more, k1 is 0 or an integer of 1 or more, k2 is an integer of 1 or more, and a sum of m and k2 is an integer of 3 or more, provided that when $Y_1$ is not a single bond, m does not exceed the valence of $Y_1$, and provided that a sum of k1 and k2 does not exceed the valence of $L_1$.

The multi-thiol compound may include a compound represented by Chemical Formula 2:

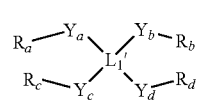

Chemical Formula 2

In Chemical Formula 2, $L_1'$ is carbon, a substituted or unsubstituted C2 to C20 alkylene group, a substituted or unsubstituted C6 to C30 arylene group; a substituted or unsubstituted C3 to C30 heteroarylene group; a substituted or unsubstituted C3 to C30 cycloalkylene group; a substituted or unsubstituted C3 to C30 heterocycloalkylene group, $Y_a$ to $Y_d$ are independently a direct bond; a substituted or unsubstituted C1 to C30 alkylene group; a substituted or unsubstituted C2 to C30 alkenylene group; or a C1 to C30 alkylene group or a C2 to C30 alkenylene group wherein a, e.g., at least one, methylene (—CH$_2$—) is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, and $R_a$ to $R_d$ are $R^1$ or SH of Chemical Formula 2, provided that at least two of $R_a$ to $R_d$ are SH.

The thiol compound may be a dithiol compound, a trithiol compound, a tetrathiol compound, or a combination thereof. For example, the thiol compound may be glycoldi-3-mercaptopropionate, glycol dimercapto acetate, trimethylolpropane tris(3-mercaptopropionate), pentaerythritol tetrakis (3-mercaptopropionate), pentaerythritol tetrakis (2-mercaptoacetate), 1,6-hexanedithiol, 1,3-propanedithiol, 1,2-ethanedithiol, polyethylene glycol dithiol including 1 to 10 ethylene glycol repeating units, or a combination thereof.

As described herein, the quantum dots according to an embodiment have high quantum efficiency, and thus, the quantum efficiency of the quantum dot-polymer composite may be very high. Accordingly, a display device according to an embodiment includes a light source and a photoluminescent element, e.g., a light emitting element, the photoluminescent element includes a quantum dot-polymer composite according to an embodiment, and the light source is configured to provide incident light to the photoluminescent element. The incident light may have an emission peak wavelength in a range of greater than or equal to about 440 nm, for example, greater than or equal to about 450 nm and less than or equal to about 460 nm. In an embodiment, the photoluminescent element may include a sheet or pattern of the quantum dot-polymer composite.

Figure 5:
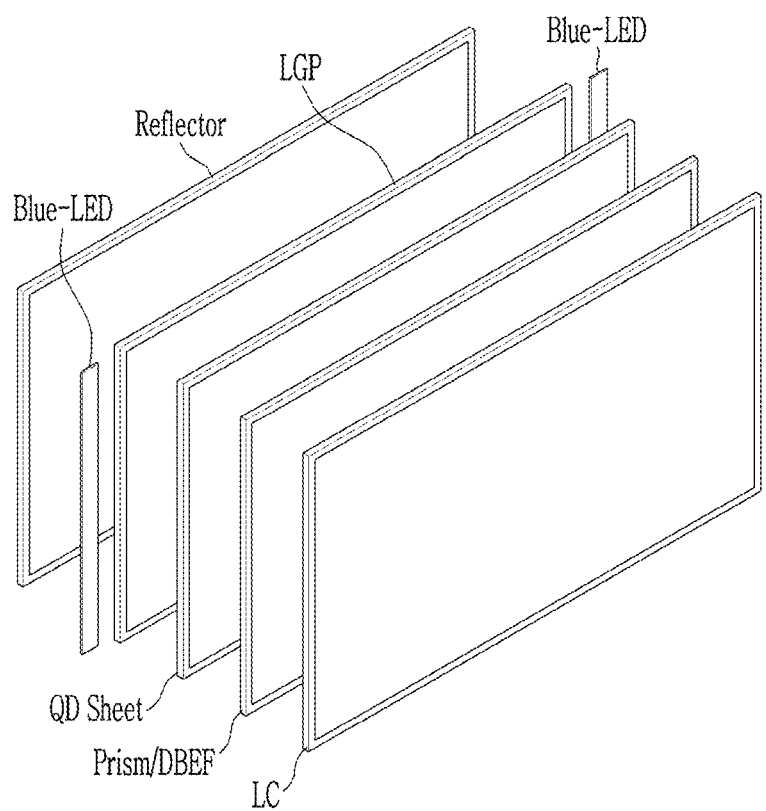
FIG. 5 is an exploded view of a display device according to an embodiment.

The display device may further include a liquid crystal panel, and the sheet or pattern of the quantum dot-polymer composite may be disposed between the light source and the liquid crystal panel. FIG. 5 shows an exploded view of a non-limiting display device. Referring to FIG. 5, the display device may have a structure wherein a reflector, a light guide (LGP) and a blue light emitting diode (LED) light source (Blue-LED), the aforementioned quantum dot-polymer composite sheet (QD sheet), and for example, various optical films of a prism, and a dual brightness enhancement film (DBEF)), and the like are stacked, and a liquid crystal (LC) panel is disposed thereon.

In an embodiment, the display device may include a stacked structure including a (e.g., transparent) substrate and a light emitting layer, for example, a photoluminescent layer disposed on the substrate as a light emitting element. In the stacked structure, the light emitting layer includes a pattern of the quantum dot-polymer composite and the pattern may include a, e.g., at least one, repeating section to emit light at a predetermined wavelength. The pattern of the quantum dot-polymer composite may include a, e.g., at least one, repeating section such as a first section configured to emit first light and a second section configured to emit second light.

The first light and the second light may have different emission peak wavelengths in an emission spectrum. In an embodiment, the first light may be red light having a maximum emission peak wavelength of about 600 nm to about 650 nm (e.g., about 620 nm to about 650 nm), and the second light may be green light having a maximum emission peak wavelength of about 500 nm to about 550 nm (e.g., about 510 nm to about 550 nm).

The substrate may be a substrate including an insulation material. The substrate may include glass; various polymers such as polyesters such as polyethylene terephthalate (PET), polyethylene naphthalate (PEN), and the like, polycarbonate, polyacrylate, and the like; polysiloxane (e.g., polydimethylsiloxane (PDMS)); inorganic materials such as $Al_2O_3$, ZnO, and the like; or a combination thereof, but is not limited thereto. A thickness of the substrate may be appropriately selected taking into consideration the substrate material and the like, and is not particularly limited. The substrate may be flexible. The substrate may have a transmittance of greater than or equal to about 50%, greater than or equal to about 60%, greater than or equal to about 70%, greater than or equal to about 80%, or greater than or equal to about 90% for light emitted from the quantum dot.

At least a portion of the substrate may be configured to block (e.g., absorb or reflect) blue light. A layer capable of blocking blue light (blue light blocking layer) may be disposed on at least a portion of the surfaces of the substrate. For example, the blue light blocking layer may include an organic material (e.g., polymer) and a predetermined dye (a yellow dye or a dye that transmits green/red light and absorbs blue light), but is not limited thereto.

In the aforementioned display device, the light source may include a plurality of light emitting units corresponding to the first section and the second section respectively and the light emitting unit may include a first electrode and a second electrode facing each other and an electroluminescent layer disposed between the first electrode and the second electrode.

The electroluminescent layer may include an organic light emitting material. For example, each light emitting unit of the light source may include an electroluminescent device (e.g., an organic light emitting diode) configured to emit light of a predetermined wavelength (e.g., blue light, green light, or a combination thereof). The structures and materials of the electroluminescent device and the organic light emitting diode are not particularly limited.

Figure 6A:
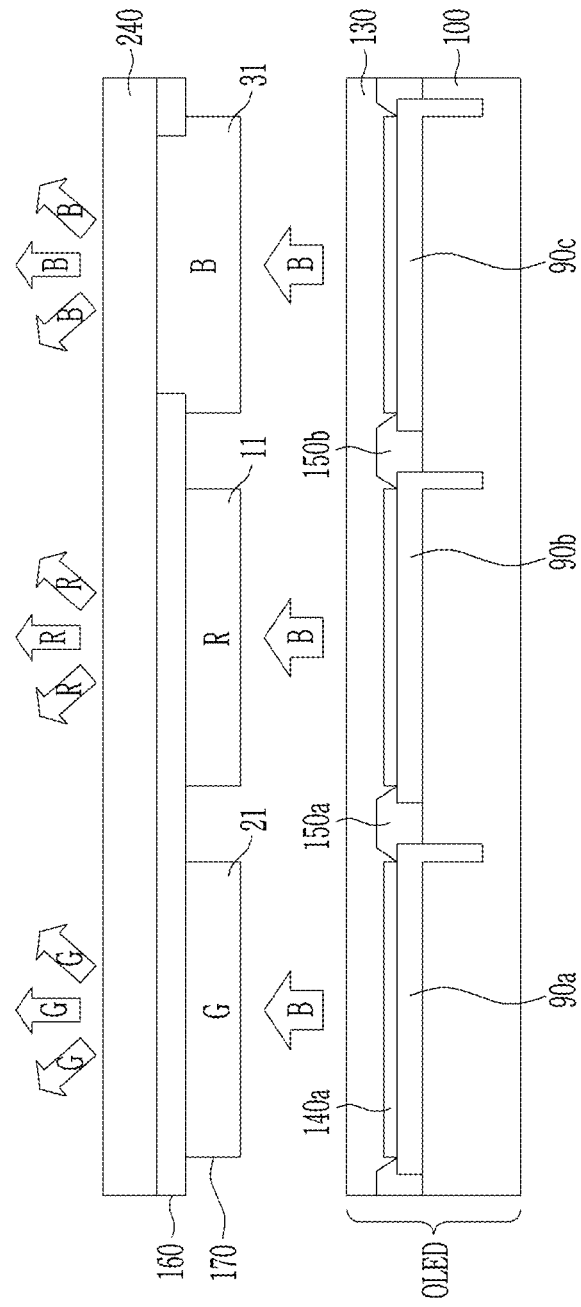
FIG. 6A is a schematic cross-sectional view of a display devices according to an embodiment and FIG. 6B is a schematic cross-sectional view of a display devices according to an embodiment.
Figure 6B:
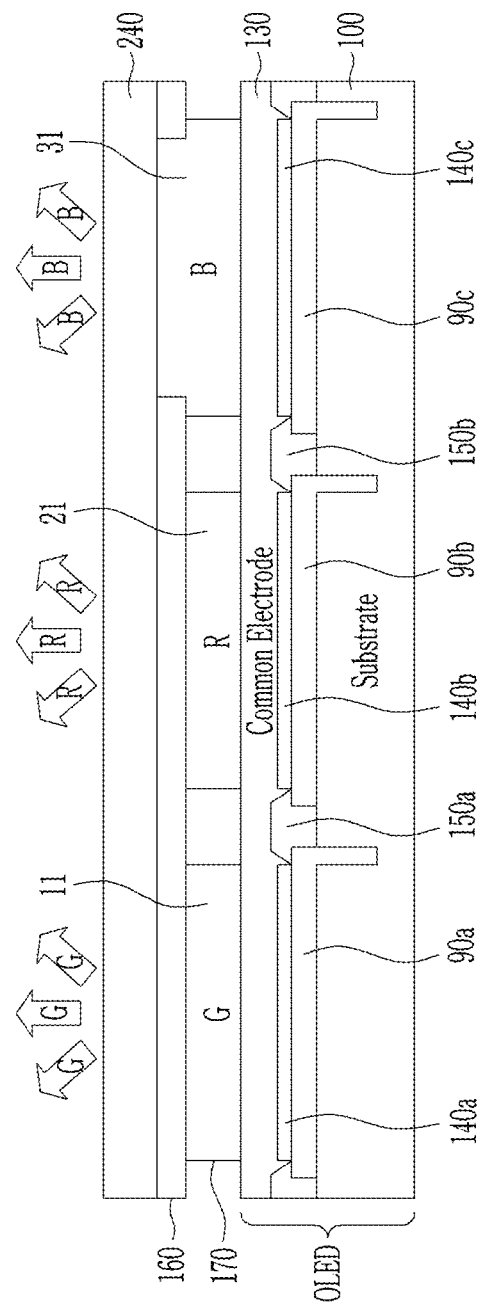

Specific examples of the display device are shown in FIGS. 6A and 6B.

In FIGS. 6A and 6B, the light source includes an organic light emitting diode (e.g., emitting blue light or light having a wavelength of less than or equal to about 500 nm). The organic light emitting diode (OLED) may include at least two pixel electrodes 90a, 90b, and 90c on a substrate 100, pixel define layers 150a, 150b, and 150c formed between neighboring pixel electrodes 90a, 90b, and 90c, organic emission layers 140a, 140b, and 140c on each pixel electrode, and a common electrode 130 layer formed on the organic emission layers.

The substrate 100 may include an insulating material and may have flexibility. Details of the substrate are the same as described herein. A line layer including a thin film transistor or the like is formed on the substrate. The line layer may further include a gate line, a sustain voltage line, a gate insulating layer, a data line, a source electrode, a drain electrode, a semiconductor, a protective layer, and the like. The detail structure of the line layer may be verified according to an embodiment. The gate line and the sustain voltage line are electrically separated from each other, and the data line is insulated and crosses the gate line and the sustain voltage line. The gate electrode, the source electrode, and the drain electrode form a control terminal, an input terminal, and an output terminal of the thin film transistor, respectively. The drain electrode is electrically connected to the pixel electrode that will be described herein.

Figure 7:
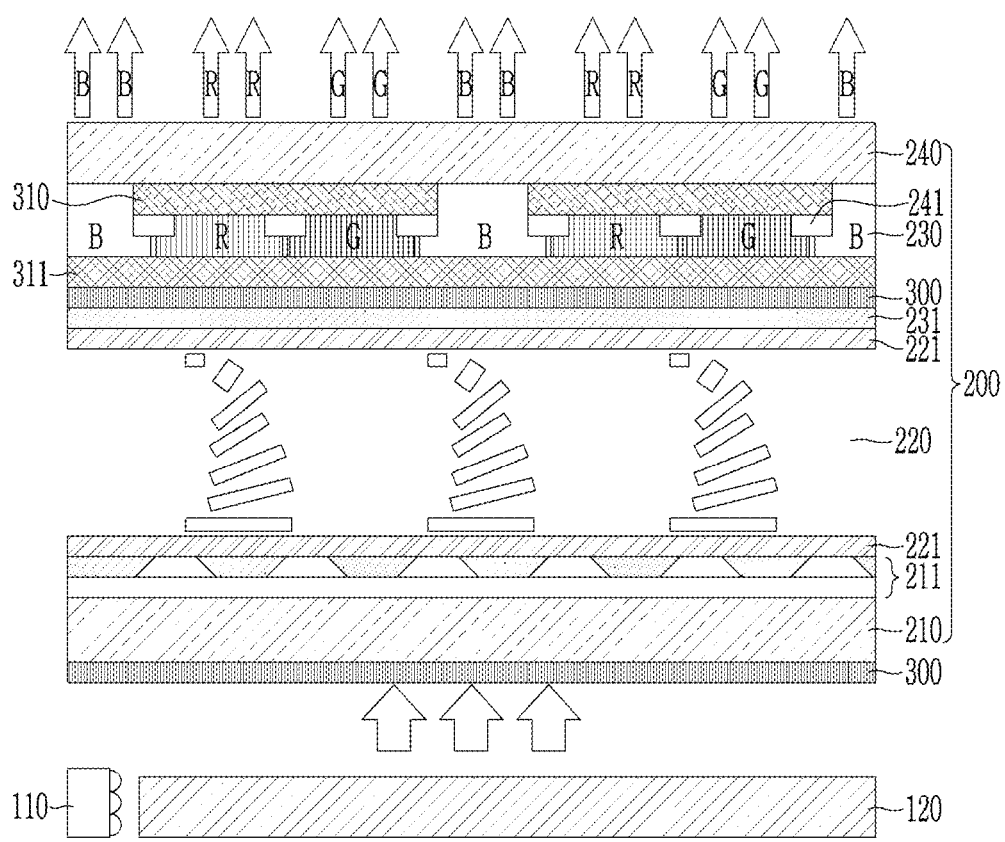
FIG. 7 is a schematic cross-sectional view of a display device according to another exemplary embodiment.

The pixel electrodes 90a, 90b, and 90c may function as an anode of the display device. The pixel electrode may include a transparent conductive material such as indium tin oxide (ITO) or indium zinc oxide (IZO). The pixel electrode may include a material having a light-blocking properties such as gold (Au), platinum (Pt), nickel (Ni), tungsten (W), chromium (Cr), molybdenum (Mo), iron (Fe), cobalt Co), copper (Cu), palladium (Pd), titanium (Ti), and the like. The pixel electrode may have a two-layered structure in which the transparent conductive material and the material having light-blocking properties are stacked sequentially. Between two adjacent pixel electrodes, a pixel define layer (PDL) 150a, 150b, and 150c overlaps with a terminal end of the pixel electrode to divide the pixel electrode into a pixel unit. The pixel define layer is an insulating layer which may electrically block the at least two pixel electrodes. The pixel define layer covers a part of the upper surface of the pixel electrode, and the remaining region of the pixel electrode that is not covered by the pixel define layer may provide an opening. An organic emission layer 140a, 140b, and 140c which will be described herein may be formed on the region defined by the opening. The organic emission layer 140a, 140b, and 140c defines each pixel area by the pixel electrode and the pixel define layer. In other words, one pixel area may be defined as an area including one organic emission unit layer which is contacted with one pixel electrode divided by the pixel define layer. For example, in the display device according to an embodiment, the organic emission layer may be defined as a first pixel area, a second pixel area, and a third pixel area, and each pixel area is spaced apart from each other leaving a predetermined interval by the pixel define layer. The organic emission layer may emit a third light belonging to visible light region or belonging to an ultraviolet (UV) region. That is, each of the first to the third pixel areas of the organic emission layer may emit a third light. In an embodiment, the third light may be a light having the highest energy in the visible light region, for example, blue light. When all pixel areas of the organic emission layer are designed to emit the same light, each pixel area of the organic emission layer may include the same or similar materials or may have the same or similar properties. Thus a process of forming the organic emission layer may be simplified, and the organic emission layer may be formed by large scale/large area applications, e.g., processes. However, the organic emission layer according to an embodiment is not necessarily limited thereto, but the organic emission layer may be designed to emit at least two different lights. The organic light emitting layer includes an organic emission unit layer in each pixel area, and each organic emission unit layer may further include an auxiliary layer (e.g., hole injection layer, hole transport layer, electron transport layer, etc.) in addition to the light emitting layer. The common electrode 130 may function as a cathode of the display device. The common electrode may include a transparent conductive material such as indium tin oxide (ITO) or indium zinc oxide (IZO). The common electrode may be formed on the organic emission layer 140a, 140b, and 140c and may be integrated therewith. A planarization layer or a passivation layer (not shown) may be formed on the common electrode. The planarization layer may include a (e.g., transparent) insulating material for ensuring electrical insulation with the common electrode. A stack structure is disposed on the light source and the stack structure c includes the pattern of the quantum dot polymer composite (e.g., a first section including a red quantum dot and a second section including a green quantum dot) and a substrate. The blue light emitted from a light source enters the first section and the second section to emit red and green light respectively. The blue light emitted from a light source may transmit the third section. This device may be manufactured by separately manufacturing the disclosed stack structure and (e.g., blue light-emitting) OLED and then assembling them. The device may be manufactured by directly forming a quantum dot polymer composite pattern on the OLED. In the device according to an embodiment, an optical element blocking (e.g., reflecting or absorbing) blue light 160 may be disposed on the first section emitting red light and the second section emitting green light. The optical element blocking blue light 160 may include a blue light reflection layer, a blue light absorption layer, or a combination thereof. The optical element blocking blue light 160 may include a blue cut filter, a polymer layer including a yellow dye, or a combination thereof, and the blue light blocking layer may be disposed on a substrate. The blue light blocking layer 160 may be disposed on the first section and the second section between the substrate and the quantum dot-polymer composite pattern. A detailed description of the blue light blocking layer is the same as that of a first optical filter 310 which will be described herein. In an embodiment, the display device may further include a lower substrate, a polarizing plate disposed under the lower substrate, and a liquid crystal layer disposed between the stacked structure and the lower substrate, and in the stacked structure, the photoluminescent layer may be disposed to face the liquid crystal layer. The display device may further include a polarizing plate between the liquid crystal layer and the photoluminescent layer. The light source may further include LED and if desired, a light guide panel. Non-limiting examples of the display device (e.g., a liquid crystal display device) according to an embodiment are illustrated with reference to a drawing. FIG. 7 is a schematic cross sectional view showing a liquid crystal display according to an embodiment. Referring to FIG. 7, the display device of an embodiment includes a liquid crystal panel 200, a polarizing plate 300 disposed under the liquid crystal panel 200, and a backlight unit (BLU) disposed under the polarizing plate 300. The liquid crystal panel 200 includes a lower substrate 210, a stacked structure, and a liquid crystal layer 220 disposed between the stacked structure and the lower substrate. The stacked structure includes a transparent substrate 240 and a photoluminescent layer 230 including a pattern of a quantum dot-polymer composite. The lower substrate 210 that is also referred to as an array substrate may be a transparent insulating material substrate. The substrate is the same as described herein. A wire plate 211 is provided on an upper surface of the lower substrate 210. The wire plate 211 may include a plurality of gate wires (not shown) and data wires (not shown) that define a pixel area, a thin film transistor disposed adjacent to a crossing region of gate wires and data wires, and a pixel electrode for each pixel area, but is not limited thereto. Details of such a wire plate are not particularly limited. The liquid crystal layer 220 may be disposed on the wire plate 211. The liquid crystal layer 220 may include an alignment layer 221 on and under the layer 220 to initially align the liquid crystal material included therein. Details (e.g., a liquid crystal material, an alignment layer material, a method of forming liquid crystal layer, a thickness of liquid crystal layer, or the like) of the liquid crystal material and the alignment layer are not particularly limited. A lower polarizing plate 300 is provided under the lower substrate. Materials and structures of the polarizing plate 300 are not particularly limited. A backlight unit (e.g., emitting blue light) may be disposed under the polarizing plate 300. An upper optical element or an upper polarizing plate 300 may be provided between the liquid crystal layer 220 and the transparent substrate 240, but is not limited thereto. For example, the upper polarizing plate may be disposed between the liquid crystal layer 220 and the photoluminescent layer 230. The polarizing plate may be any suitable polarizer that may be used in a liquid crystal display device. The polarizing plate may be TAC (triacetyl cellulose) having a thickness of less than or equal to about 200 micrometers (μm), but is not limited thereto. In an embodiment, the upper optical element may be a coating that controls a refractive index without a polarization function. The backlight unit includes a light source 110. The light source may emit blue light or white light. The light source may include a blue LED, a white LED, a white OLED, or a combination thereof, but is not limited thereto. The backlight unit may further include a light guide panel 120. In an embodiment, the backlight unit may be an edge-type lighting. For example, the backlight unit may include a reflector (not shown), a light guide panel (not shown) provided on the reflector and providing a planar light source with the liquid crystal panel 200, a, e.g., at least one, optical sheet (not shown) on the light guide panel, for example, a diffusion plate, a prism sheet, and the like, or a combination thereof, but is not limited thereto. in an embodiment, the backlight unit may not include a light guide panel. In an embodiment, the backlight unit may be a direct lighting. For example, the backlight unit may have a reflector (not shown), and may have a plurality of fluorescent lamps disposed on the reflector at regular intervals, or may have an LED operating substrate on which a plurality of light emitting diodes may be disposed, a diffusion plate thereon, and optionally a, e.g., at least one, optical sheet. Details (e.g., each component of a light emitting diode, a fluorescent lamp, light guide panel, various optical sheets, and a reflector) of such a backlight unit are not particularly limited. A black matrix (BM) 241 is provided under the transparent substrate 240 and the black matrix 241 has openings and hides a gate line, a data line, and a thin film transistor of the wire plate on the lower substrate. For example, the black matrix 241 may have a lattice shape. The photoluminescent layer 230 is provided in the openings of the black matrix 241 and has a quantum dot-polymer composite pattern including a first section (R) configured to emit first light (e.g., red light), a second section (G) configured to emit second light (e.g., green light), and a third section (B) configured to emit/transmit, for example blue light. If desired, the photoluminescent layer may further include a, e.g., at least one, fourth section. The fourth section may include a quantum dot that emits different color from light emitted from the first to third sections (e.g., cyan, magenta, and yellow light). In the photoluminescent layer 230, sections forming a pattern may be repeated corresponding to pixel areas formed on the lower substrate. A transparent common electrode 231 may be provided on the photoluminescent color filter layer. The third section (B) configured to emit/transmit blue light may be a transparent color filter that does not change a photoluminescence spectrum of the light source. Blue light emitted from the backlight unit may enter in a polarized state and may be emitted through the polarizing plate and the liquid crystal layer as is. If desired, the third section may include a quantum dot emitting blue light. Optionally, the display device may further have a blue light blocking layer (blue cut filter) or a first optical filter 310 layer. The blue light blocking layer may be disposed between bottom surfaces of the first section (R) and the second section (G) and the upper substrate 240, or on the top surface of the upper substrate 240. The blue light blocking layer may be a sheet having openings that correspond to a pixel area showing, e.g., emitting, a blue color (e.g., third section) and may be formed on portions corresponding to the first and second sections. That is, the first optical filter layer may be integrally formed as one body structure at the portions except portions overlapped with the third section as shown in FIG. 7, but is not limited thereto. At least two first optical filter layers 310 and 311 may be spaced apart and be disposed on each of the portions overlapped with the first and the second sections. For example, the first optical filter layer may block light having a portion of a wavelength region in the visible light region and transmit light having other wavelength regions. For example, the first optical filter layer may block blue light and transmit light except blue light. For example, the first optical filter layer may transmit green light, red light, and/or or yellow light that is mixed light thereof. For example, the first optical filter layer may substantially block blue light having a wavelength of less than or equal to about 500 nm and may transmit light in another visible light wavelength region of greater than about 500 nm and less than or equal to about 700 nm. For example, the first optical filter layer may have light transmittance of greater than or equal to about 70%, greater than or equal to about 80%, greater than or equal to about 90%, or about 100% with respect to the other visible light of greater than about 500 nm and less than or equal to about 700 nm. The first optical filter layer may include a polymer thin film including a dye that absorbs light having a wavelength to be blocked, a pigment that absorbs light having a wavelength to be blocked, or a combination thereof. The first optical filter layer may block at least 80%, at least 90%, or at least 95% of blue light having a wavelength of less than or equal to about 480 nm and the first optical filter layer may have light transmittance of greater than or equal to about 70%, greater than or equal to about 80%, greater than or equal to about 90%, or about 100% with respect to other visible light of greater than about 500 nm and less than or equal to about 700 nm. The first optical filter layer may substantially block (e.g., absorb) blue light having a wavelength of less than or equal to about 500 nm and for example may selectively transmit green light or red light. At least two first optical filter layers may be spaced apart and disposed on each of the portions overlapped with the first and second sections, respectively. For example, a first optical filter layer selectively transmitting red light may be disposed on the portion overlapped with the section emitting red light and the first optical filter layer selectively transmitting green light may be disposed on the portion overlapped with the section emitting green light, respectively. For example, the first optical filter layer may include a first region, a second region, or a combination thereof wherein the first region blocks (e.g., absorb) blue light and red light and transmits light having a wavelength of a predetermined range (e.g., greater than or equal to about 500 nm, greater than or equal to about 510 nm, or greater than or equal to about 515 nm and less than or equal to about 550 nm, less than or equal to about 545 nm, less than or equal to about 540 nm, less than or equal to about 535 nm, less than or equal to about 530 nm, less than or equal to about 525 nm, or less than or equal to about 520 nm) and the second region blocks (e.g., absorb) blue light and green light and transmits light having a wavelength of a predetermined range (e.g., greater than or equal to about 600 nm, greater than or equal to about 610 nm, or greater than or equal to about 615 nm and less than or equal to about 650 nm, less than or equal to about 645 nm, less than or equal to about 640 nm, less than or equal to about 635 nm, less than or equal to about 630 nm, less than or equal to about 625 nm, or less than or equal to about 620 nm). The first region may be disposed at a place overlapped with the section emitting green light and the second region may be disposed at a place overlapped with the section emitting red light. The first region and the second region may be optically isolated. The first optical filter layer may contribute to improving color purity of a display device. The first optical filter layer may be a reflective filter including a plurality of layers (e.g., inorganic material layers) with different refractive index. For example, two layers having a different refractive index may be alternately stacked with each other, or for example a layer having a high refractive index and a layer having a low refractive index may be alternately stacked with each other.

As a refractive index difference between the layer having a high refractive index and the layer having a low refractive index is higher, the first optical filter layer having higher wavelength selectivity may be provided. A thickness and the stacked number of the layer having a high refractive index and the layer having a low refractive index may be determined according to a refractive index of each layer and a reflected wavelength, for example, each layer having a high refractive index may have a thickness of about 3 nm to about 300 nm, and each layer having a low refractive index may have a thickness of about 3 nm to about 300 nm. A total thickness of the first optical filter layer may be, for example, from about 3 nm to about 10,000 nm, about 300 nm to about 10,000 nm, or about 1,000 nm to about 10,000 nm. All layers having a high refractive index may have the same thickness and the same material or different from each other, and all layers having a low refractive index may have the same thickness and the same material or different from each other. The display device may further include a second optical filter layer (e.g., red/green or yellow light recycling layer) 311 disposed between the photoluminescent layer and the liquid crystal layer (e.g., between photoluminescent layer and upper polarizer) and transmitting at least a portion of the third light and reflecting at least a portion of the first light and the second light. The second optical filter layer 311 may reflect light in a wavelength region of greater than about 500 nm. The first light may be red light, the second light may be green light, and the third light may be blue light. In the display device according to an embodiment, the second optical filter layer may be formed as an integrated one layer having a relatively planar surface. In an embodiment, the second optical filter layer may include a monolayer having a low refractive index, for example, the second optical filter layer may be a transparent thin film having a refractive index of less than or equal to about 1.4, less than or equal to about 1.3, or less than or equal to about 1.2. The second optical filter layer having a low refractive index may be, for example, a porous silicon oxide, a porous organic material, a porous organic/inorganic composite, or a combination thereof. In an embodiment, the second optical filter layer may include a plurality of layers having different refractive indexes, for example, the second optical filter layer may be formed by alternately stacking two layers having different refractive indexes, or for example, the second optical filter layer may be formed by alternately stacking material having a high refractive index and material having a low refractive index. The layer having a high refractive index in the second optical filter layer may include, for example, hafnium oxide, tantalum oxide, titanium oxide, zirconium oxide, magnesium oxide, cesium oxide, lanthanum oxide, indium oxide, niobium oxide, aluminum oxide, and silicon nitride, or a combination thereof but according to an embodiment, the layer having a high refractive index in the second optical filter layer may include a variety of materials having a higher refractive index than the layer having a low refractive index. The layer having a low refractive index in the second optical filter layer may include, for example, a silicon oxide, but according to an embodiment, the layer having a low refractive index in the second optical filter layer may include may include a variety of materials having a lower refractive index than the layer having a high refractive index. As the refractive index difference between the layer having a high refractive index and the layer having a low refractive index is the higher, the second optical filter layer may have the higher wavelength selectivity. In the second optical filter layer, each thickness of the layer having a high refractive index and the layer having a low refractive index and the stacked number thereof may be determined depending upon a refractive index of each layer and the reflected wavelength, for example, each layer having a high refractive index in the second optical filter layer may have a thickness of about 3 nm to about 300 nm, and each layer having a low refractive index in the second optical filter layer may have a thickness of about 3 nm to about 300 nm. A total thickness of the second optical filter layer may be, for example, from about 3 nm to about 10,000 nm, about 300 nm to about 10,000 nm, or about 1,000 nm to about 10,000 nm. Each of the layer having a high refractive index and the layer having a low refractive index in the second optical filter layer may have the same thickness and materials or different thickness and materials from each other. The second optical filter layer may reflect at least a portion of the first light (R) and the second light (G) and transmits at least a portion (e.g., whole part) of the third light (B). For example, the second optical filter layer 140 may transmit only the third light (B) in a blue light wavelength region of less than or equal to about 500 nm and light in a wavelength region of greater than about 500 nm, that is, green light (G), yellow light, red light (R), and the like may be not passed through the second optical filter layer and reflected. Thus the reflected green light and red light may pass through the first and the second sections to be emitted to the outside of the display device. The second optical filter layer may reflect a wavelength region of greater than about 500 nm in greater than or equal to about 70%, greater than or equal to about 80%, or greater than or equal to about 90%, or about 100%. The second optical filter layer may have a transmittance to a wavelength region of less than or equal to about 500 nm of, for example, greater than or equal to about 90%, greater than or equal to about 92%, greater than or equal to about 94%, greater than or equal to about 96%, greater than or equal to about 98%, greater than or equal to about 99%, or about 100%. In an embodiment, the aforementioned quantum dot-polymer composite pattern may be produced by a method using the photoresist composition. The method may include forming a film of the aforementioned composition on a substrate; exposing a selected region of the film to light (e.g., a wavelength of less than or equal to about 400 nm); and developing the exposed film with an alkali developing solution to obtain a pattern of the quantum dot-polymer composite.

Figure 8:
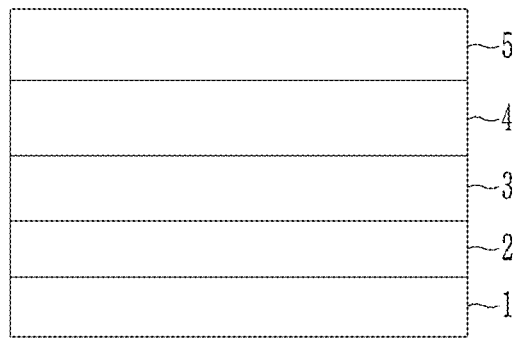
FIG. 8 is a schematic cross-sectional view of an electroluminescent device according to an embodiment.

The quantum dots according to an embodiment may be used as a light emitting layer in an electroluminescent device including quantum dots (see FIG. 8). The luminescent device includes an anode 1 and a cathode 5 facing each other; a quantum dot light emitting layer 3 between the anode and the cathode and including a plurality of quantum dots; and a hole auxiliary layer 2 between the anode and the quantum dot light emitting layer. The hole auxiliary layer may further include a hole injecting layer (HIL), a hole transporting layer (HTL), an electron blocking layer (EBL), or a combination thereof. The hole auxiliary layer may include any suitable organic/inorganic material having hole properties. The quantum dot light emitting device may further include an electron auxiliary layer 4 between the cathode and the quantum dot light emitting layer. The electron auxiliary layer may further include an electron injecting layer (EIL), an electron transporting layer (ETL), a hole blocking layer (HBL), or a combination thereof. The electron auxiliary layer may include any suitable organic/inorganic material having electronic properties.

Hereinafter, the embodiments are illustrated in more detail with reference to examples. However, they are exemplary embodiments of the present invention, and the present invention is not limited thereto.

EXAMPLES

Analysis Methods
1. Photoluminescence Analysis

Using a Hitachi F-7000 spectrometer, a photoluminescence (PL) spectrum of produced nanocrystals at an irradiation wavelength of 372 nanometers (nm) is obtained.

2. Inductively Coupled Plasma (ICP) Analysis

Using Shimadzu ICPS-8100, an inductively coupled plasma atom light emitting spectroscopy analysis (ICP-AES) is performed.

3. X-Ray Diffraction (XRD) Analysis

Using a Philips XPert PRO instrument, XRD analysis is performed with a power of 3 kilowatts (kVV).

4. Transmission Electron Microscope (TEM) Analysis

Using a UT F30 Tecnai electron microscope, a transmission electron micrograph of a quantum dot is obtained.

Syntheses are carried out in an inert gas atmosphere (under nitrogen flowing conditions) unless otherwise specified.

Reference Example 1: Production of $ZnTe_{0.67}Se_{0.33}$ Core Having Radius of About 1.5 nm A Se/trioctylphosphine (TOP) stock solution, a S/TOP stock solution, and a Te/TOP stock solution having a concentration of about 0.1 moles per liter (molar (M)) to 0.4 M are obtained by dispersing selenium, sulfur, and tellurium, respectively, in trioctylphosphine (TOP). A mixed solution including the Te/TOP stock solution, an organic ligand including diphenylphosphine and oleylamine, and lithium aluminum hydride is prepared.

In a 300 milliliter (mL) reaction flask, 0.9 millimoles (mmol) of zinc acetate is dissolved in 1-octadecene with oleic acid, and heated to 120° C. under vacuum. After 1 hour, the atmosphere in the reactor is converted to an inert gas and heated to 300° C. Subsequently, the mixed solution including the Te/TOP stock solution and the Se/TOP stock solution is rapidly injected to the reactor, and reacted to provide a core. Then, the reaction solution is promptly cooled at a room temperature and added with acetone, and centrifuged to provide a precipitate. Then, the precipitate is dispersed in toluene to provide a ZnTeSe core. The amount of Te relative to 1 mole of Se is about 2 moles.

From the result of analyzing an image using a Transmission Electron Microscope (TEM), it is confirmed that the obtained ZnTeSe core has a radius of about 1.5 nm.

Reference Example 2: Production of $ZnTe_{0.67}Se_{0.33}$ Core Having Radius of About 2.2 nm A core is synthesized in accordance with the same procedure as in Reference Example 1, except that the obtained ZnTeSe core has a radius of about 2.2 nm by prolonging the reaction time after injecting the mixed solution of Te/TOP stock solution and Se/TOP stock solution stated in Reference Example 1 during forming the core.

A TEM analysis for measuring a core size for the obtained ZnTeSe core is performed as in Reference Example 1, so it is confirmed if the core according to Reference Example 2 is the same as the core obtained from Reference Example 1 in the composition and spectral characteristics, and the like of the core, except the core radius.

Examples 1 to 4

TOA (trioctyl acetate) is added into a 300 mL reaction flask and added with zinc acetate and oleic acid, and then vacuumed at 120° C. The inside of the flask is substituted with nitrogen ($N_2$). While the reaction flask is heated up to 300° C., the toluene dispersion of the ZnTeSe core obtained from Reference Example 1 is rapidly added. Subsequently, the Se/TOP stock solution is added to the reactor, and each of them is reacted for different time to provide quantum dots having a ZnTeSe/ZnSe core/shell structures according to Examples 1 to 4, which include ZnSe layers having each different thickness on the core.

For each obtained quantum dot, a shell thickness is measured using TEM, and a mole ratio of Se:Te in the quantum dot is measured by performing an inductively coupled plasma atomic emission spectrometry (ICP-AES). The results are also shown in Table 1.

Figure 9:
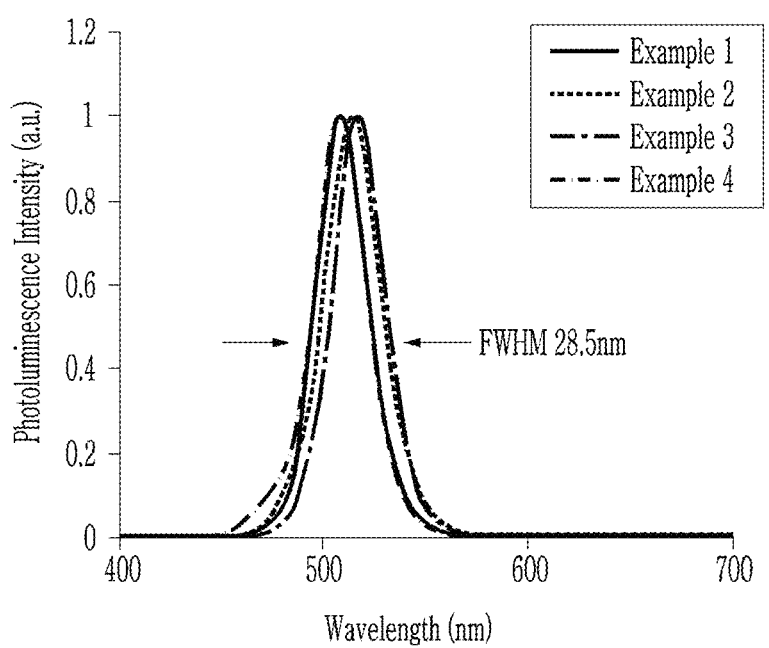
FIG. 9 is a graph of photoluminescence intensity (arbitrary units (a.u.)) versus wavelength (nm) showing emission spectra of core-shell quantum dots synthesized in Examples 1 to 4.

In addition, the luminescence properties for each quantum dot are analyzed, and the results are shown in Table 1. Further, the emission spectra of the quantum dots according to Example 1 to 4 are shown in FIG. 9.

Comparative Examples 1 and 2

Quantum dots of ZnTeSe/ZnSe core-shell structures according to Comparative Examples 1 and 2 having different shell thicknesses are obtained in accordance with the same procedure as in Examples 1 to 3, except that the core obtained from Reference Example 2 is used.

Figure 10:
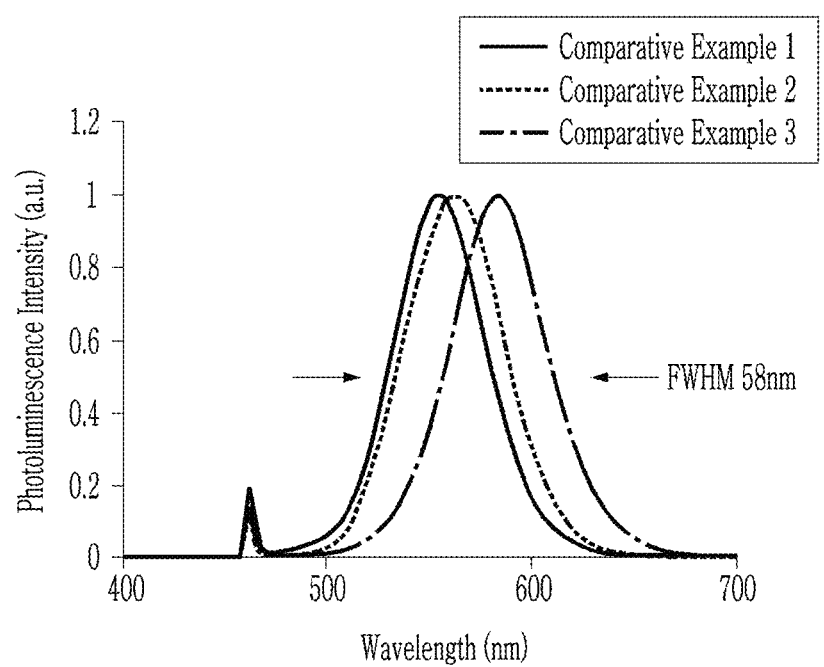
FIG. 10 is a graph of photoluminescence intensity (a.u.) versus wavelength (nm) showing emission spectra of core-shell quantum dots synthesized in Comparative Examples 1 to 3.

The shell thickness of the obtained quantum dot, a mole ratio of Se:Te in quantum dot, and luminescence properties are measured in accordance with the same procedure as in Examples 1 to 3, and the results are also shown in Table 1. Further, the emission spectrum of the quantum dot is shown in FIG. 10.

Comparative Example 3

A core-shell quantum dot is obtained as in Comparative Examples 1 and 2, except that the S/TOP solution obtained from Reference Example 1 is further added besides the Se/TOP solution during forming a shell to provide ZnTeSe/ZnSe/ZnS core-shell quantum dots.

Specifically, zinc acetate and oleic acid are added into a 300 mL reaction flask during forming the shell and vacuumed, and substituted with nitrogen ($N_2$). Then, the toluene dispersion of ZnTeSe core obtained from Reference Example 2 is rapidly added to the reactor, while heating the reaction flask up to 300° C. Subsequently, it is reacted for a predetermined time by adding the Se/TOP stock solution to provide a ZnSe shell on the core, and it is further reacted by adding the S/TOP stock solution together with zinc acetate to provide a ZnS shell layer on the Zn/Se shell layer.

A shell thickness of the obtained ZnTeSe/ZnSe/ZnS quantum dot, a mole ratio of Se:Te in quantum dot, and luminescence properties are measured in accordance with the same procedure as in Examples 1 to 3, and the results are shown in Table 1. Further, an emission spectrum of the quantum dot according to Comparative Example 3 is also shown in FIG. 10.

TABLE 1

|  | ZnSe$_y$S$_{(1-y)}$ shell Thickness (nm) | Mole Ratio of (Se + S):Te | Emission peak wavelength(nm) | Full width at half maximum (FWHM) (nm) | PL Quantum Efficiency (QY) (%) |
| --- | --- | --- | --- | --- | --- |
| Example 1 | 0.48 | 2.3:1 | 510 | 28.5 | 37 |
| Example 2 | 0.37 | 2.1:1 | 516 | 28.7 | 45 |
| Example 3 | 0.36 | 1.8:1 | 518 | 28.3 | 33 |
| Example 4 | 0.31 | 1.7:1 | 512 | 29.3 | 37 |
| Comparative Example 1 | 0.45 | 3.3:1 | 554 | 52 | 27 |
| Comparative Example 2 | 0.52 | 3.7:1 | 563 | 58 | 58 |
| Comparative Example 3 | 0.9 | 5.9:1 | 583 | 54 | 48 |

As shown in Table 1 and FIG. 9, it is noted that the quantum dots according to Examples 1 to 4 have a mole number of tellurium being higher than a mole number of selenium in a core, a ratio of a sum of mole numbers of selenium and sulfur relative to a mole number of tellurium being greater than 1 in the entire quantum dot, the quantum efficiency having an emission peak wavelength of greater than or equal to 500 nm and less than or equal to 550 nm of greater than or equal to 30%, and a FWHM of less than or equal to 30 nm. Accordingly, it is understood that the quantum dot according to an embodiment has excellent luminescence properties in a short wavelength green light region. The quantum dot may be a ZnTeSe-based quantum dot having a core radius of less than or equal to 2 nm, for example, 1.5 nm, and a shell thickness of greater than or equal to 1 monolayer, for example, greater than or equal to about 0.3 nm.

On the other hand, the quantum dots according to Comparative Examples 1 to 3 also show that both a ratio of a mole number of tellurium to a mole number of selenium in core and a ratio of a sum of mole numbers of selenium and sulfur relative to a mole number tellurium in a quantum dot are greater than 1:1, which are same as the quantum dots according to the Examples. However, the quantum dots of the Comparative Examples have the emission peak wavelengths of greater than 550 nm, so as to emit green light of a long wavelength region, and the FWHMs thereof are also all greater than 30 nm. Therefore, it is understood that the quantum dots according to the Comparative Examples show unfavorable luminescence properties compared to the quantum dots according to an embodiment.

From the Examples and Comparative Examples, it is understood that in ZnTeSe-based quantum dot according to an embodiment, a shell thickness may be controlled to provide a quantum dot which stably emits light in a desired emission wavelength region by adjusting the amounts of selenium and tellurium in a core at a predetermined ratio and maintaining a core radius below, e.g., smaller than, a predetermined size, and even in this case, the ZnTeSe-based quantum dot may have a narrower FWHM and show, e.g., exhibit, an excellent quantum efficiency.

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

What is claimed is:

1. A quantum dot, comprising
a core comprising a first semiconductor nanocrystal comprising zinc, selenium, and tellurium, and
a semiconductor nanocrystal shell disposed on the core, the semiconductor nanocrystal shell comprising
zinc, and
selenium, sulfur, or a combination thereof,
wherein the quantum dot does not comprise cadmium,
a mole ratio of tellurium relative to selenium in the first semiconductor nanocrystal is greater than about 1:1,
a mole ratio of a sum of selenium and sulfur relative to tellurium in the quantum dot is greater than 1:1,
a wavelength of a maximum emission peak of the quantum dot is in a range of from about 500 nanometers to about 550 nanometers, and
the quantum dot has a quantum efficiency of greater than or equal to about 30%.

2. The quantum dot of claim 1, wherein the wavelength of the maximum emission peak is in a range of greater than or equal to about 500 nanometers and less than or equal to about 540 nanometers.

3. The quantum dot of claim 1, wherein a full width at half maximum of the maximum emission peak of the quantum dot is less than or equal to about 30 nanometers.

4. The quantum dot of claim 1, wherein the quantum dot has a mole ratio of zinc to a sum of selenium and sulfur in the quantum dot of greater than or equal to about 1:1.

5. The quantum dot of claim 1, wherein a radius of the core of the quantum dot is less than or equal to about 2 nanometers.

6. The quantum dot of claim 1, wherein a radius of the core of the quantum dot is less than or equal to about 1.8 nanometers.

7. The quantum dot of claim 1, wherein a thickness of the shell of the quantum dot is about 1 monolayer or more.

8. The quantum dot of claim 1, wherein an average particle size of the quantum dot is greater than or equal to about 3 nanometers.

9. The quantum dot of claim 1, wherein an average particle size of the quantum dot is greater than or equal to about 3.5 nanometers.

10. The quantum dot of claim 1, wherein the semiconductor nanocrystal shell of the quantum dot has a composition that changes in a radial direction.

11. The quantum dot of claim 1, wherein the semiconductor nanocrystal shell of the quantum dot comprises
a first layer disposed directly on the core, and
a second layer disposed on the first layer, wherein the first layer comprises a second semiconductor nanocrystal, and the second layer comprises a third semiconductor nanocrystal having a composition different from that of the second semiconductor nanocrystal.

12. The quantum dot of claim 11, wherein
the second semiconductor nanocrystal comprises zinc, selenium, and optionally sulfur, and
the third semiconductor nanocrystal comprises zinc and sulfur.

13. The quantum dot of claim 12, wherein
the second layer of the semiconductor nanocrystal shell is an outermost layer, and
the third semiconductor nanocrystal does not comprise selenium.

14. The quantum dot of claim 1, wherein a surface of the quantum dot comprises RCOOH, RCOOCOR, $RNH_2$, $R_2NH$, $R_3N$, RSH, $R_3PO$, $R_3P$, ROH, RCOOR', $RPO(OH)_2$, $R_2POOH$, or a combination thereof, wherein, R and R' are independently a substituted or unsubstituted C1 to C30 aliphatic hydrocarbon group, a substituted or unsubstituted C6 to C30 substituted or unsubstituted aromatic hydrocarbon group, or a combination thereof.

15. A quantum dot-polymer composite, comprising
a polymer matrix; and
the quantum dot of claim 1 dispersed in the polymer matrix.

16. The quantum dot-polymer composite of claim 15, wherein the polymer matrix comprises a thiol-ene resin, a (meth)acrylate polymer, a urethane polymer, an epoxy polymer, a vinyl polymer, a silicone polymer, or a combination thereof.

17. A display device, comprising
a light source; and
a luminescent element,
wherein the luminescent element comprises the quantum dot-polymer composite of claim 15, and
the light source is configured to provide the luminescent element with incident light.

18. An electroluminescent device, comprising
a first electrode and a second electrode facing each other; and
a quantum dot light emitting layer between the first electrode and the second electrode, the quantum dot light emitting layer comprising a plurality of quantum dots,
wherein the quantum dots comprise the quantum dot of claim 1.

19. The electroluminescent device of claim 18, wherein the electroluminescent device comprises a charge auxiliary layer between the first electrode and the quantum dot light emitting layer, between the second electrode and the quantum dot light emitting layer, or between the first electrode and the quantum dot light emitting layer and between the second electrode and the quantum dot light emitting layer.

20. The electroluminescent device of claim 19, wherein the charge auxiliary layer comprises a charge transporting layer, a charge injecting layer, or a combination thereof.

* * * * *